United States Patent
Juen

(10) Patent No.: US 7,236,198 B2
(45) Date of Patent: Jun. 26, 2007

(54) IMAGE-CAPTURING DEVICE WITH LIGHT DETECTION CAPABILITY

(75) Inventor: Masahiro Juen, Yokohama (JP)

(73) Assignee: Nikon Corporation, Tokyo (JP)

( * ) Notice: Subject to any disclaimer, the term of this patent is extended or adjusted under 35 U.S.C. 154(b) by 623 days.

(21) Appl. No.: 10/453,558

(22) Filed: Jun. 4, 2003

(65) Prior Publication Data
US 2003/0197798 A1 Oct. 23, 2003

Related U.S. Application Data

(63) Continuation of application No. 09/267,655, filed on Mar. 15, 1999, now abandoned.

(30) Foreign Application Priority Data

Mar. 19, 1998 (JP) ................... 10-070453

(51) Int. Cl.
*H04N 3/14* (2006.01)
*H04N 5/335* (2006.01)
(52) U.S. Cl. ...................... 348/308; 348/301
(58) Field of Classification Search ............... 348/294, 348/302, 308, 301, 307, 303–306, 309, 310; 257/292, 258, 291, 293, 294; 356/222
See application file for complete search history.

(56) References Cited

U.S. PATENT DOCUMENTS

| | | | |
|---|---|---|---|
| 4,939,579 A | 7/1990 | Nakamura | |
| 5,404,316 A | 4/1995 | Klingler et al. | |
| 5,477,337 A | 12/1995 | Schuler | |
| 5,513,306 A | 4/1996 | Mills et al. | |
| 5,563,429 A | 10/1996 | Isogai | |
| 6,046,466 A | 4/2000 | Ishida et al. | |

FOREIGN PATENT DOCUMENTS

JP   A-8-293591   11/1996

*Primary Examiner*—Tuan Ho
*Assistant Examiner*—Jason Whipkey
(74) *Attorney, Agent, or Firm*—Oliff & Berridge, PLC

(57) ABSTRACT

An image capturing device in which a plurality of pixels are two-dimensionally arrayed on one semiconductor substrate. First pixels are each provided with a first photoelectric conversion portion for capturing an image of a subject, the first amplifier portion is used for amplifying a signal generated at the first photoelectric conversion portion, and the first reset portion is used for resetting the signal generated at the first photoelectric conversion portion and a photoelectric conversion portion for photometry employed for photometering the subject. Second pixels are each provided with a second photoelectric conversion portion for capturing the image of the subject, the second amplifier portion is used for amplifying a signal generated by the second photoelectric conversion portion, and the second reset portion is used for resetting the signal generated at the second photoelectric conversion portion, The first pixels and the second pixels are arrayed with a specifically combined array pattern.

11 Claims, 19 Drawing Sheets

IMAGE-CAPTURING DEVICE WITH LIGHT DETECTION CAPABILITY

CROSS-REFERENCE TO RELATED APPLICATION

The disclosure of the following priority application is herein incorporated by reference: Japanese Patent Application No. 10-70453 filed Mar. 19, 1998.

BACKGROUND

1. Field of the Invention

The present invention relates to an image capturing device employed in an electronic camera and the like, and more specifically it relates to a light quantity detection required in decision-making with respect to exposure conditions.

2. Description of the Related Art

An image capturing device achieved by two-dimensionally arraying a great number of photoelectric conversion cells (pixels) is employed to convert the image of a subject to an electrical signal in an electronic camera and the like. At each photoelectric conversion cell in the image capturing device, the electrical charge corresponding to the intensity of the incident light and the length of exposure time (the length of time over which the electrical charge is stored) is generated and stored.

This type of image capturing device includes CCD image capturing devices employing CCD elements to constitute photoelectric conversion cells and amplifier-type image capturing devices employing amplifier elements as photoelectric conversion cells. The amplifier-type image capturing devices in the prior art include, for instance, that disclosed in Japanese Laid-Open Patent Publication No. H8-293591. In this prior art technology, junction-type field effect transistors (J-FET) are employed as amplifying elements.

Each photoelectric conversion cell in an image capturing device is provided with a photoelectric conversion portion, a reset portion, an electrical charge transfer portion, an amplifier portion and the like. The reset portion is used for the initialization of the stored electrical charge. The electrical charge transfer portion transfers the electrical charge that has been stored at the photoelectric conversion portion to the amplifier portion.

In this type of image capturing device, the quantity of stored electrical charge at each photoelectric conversion cell is determined in correspondence to the intensity of the incident light and the length of exposure time.

If the illumination of the subject is extremely low, the quantity of the stored electrical charge at each corresponding photoelectric conversion cells is reduced. This results in an increase in the degree of influence of the noise components such as the dark current, which, in turn, leads to poor image quality.

In addition, if the illumination of the subject is extremely high, the adverse effect of the electrical charge flowing out from the high intensity pixel to adjacent pixels results in blooming (bleeding) and smearing in the photographed image.

When the illumination of the subject is low, the degree of the influence of noise can be reduced by increasing the length of exposure time, since this will increase the quantity of stored electrical charge. When the illumination of the subject is extremely high, on the other hand, the length of exposure time may be reduced to keep down the quantity of stored electrical charge so that the electrical charge is prevented from flowing out from a high intensity pixel to adjacent pixels.

In order to achieve such control of the exposure time, it is essential that the exposure state be accurately ascertained. However, in a common charge-storage type solid image capturing device, the charges at the individual photoelectric conversion cells cannot be read out until the actual exposure is completed.

Consequently, in order to detect the photographing environment such as the brightness of the subject, a special exposure meter must be provided. However, since the quantity of scattered reflected light at the detection surface is small in a solid image capturing device, TTL photometry as performed in a camera using silver halide film cannot be implemented.

Thus, it is difficult to accurately measure the intensity of light entering the detection surface of the image capturing device and the exposure quantity. In other words, it is difficult to accurately ascertain the photographing environment unless the state of the image photographed by actually performing photographing is checked.

In addition, in order to perform photographing at a correct exposure for various subjects, it is necessary to detect the quantities of light at a plurality of areas on the photosensitive surface of the image capturing device.

SUMMARY

A main object of the present invention is to achieve detection of the quantity of light entering the image capturing surface almost concurrently as a photographing operation progresses and to realize detection of the quantity of light at each of a plurality of areas on the image capturing surface.

In order to attain the above object, an image capturing device according to the present invention in which a plurality of pixels are two-dimensionally arrayed on one semiconductor substrate, comprises: first pixels each provided with a first photoelectric conversion portion for capturing an image of a subject, a first amplifier portion for amplifying a signal generated at the first photoelectric conversion portion, a first reset portion for resetting the signal generated at the first photoelectric conversion portion and a photoelectric conversion portion for photometry employed for photometering the subject; and second pixels each provided with a second photoelectric conversion portion for capturing the image of the subject, a second amplifier portion for amplifying a signal generated by the second photoelectric conversion portion and a second reset portion for resetting the signal generated at the second photoelectric conversion portion, and the first pixels and the second pixels are arrayed with a specifically combined array pattern.

In the above image capturing device, the plurality of pixels are arrayed two-dimensionally in a first direction and in a second direction perpendicular to the first direction. And, preferably, a plurality of the first pixels and a plurality of the second pixels are arrayed in each of lines that extends in the first direction; a plurality of types of line array pattern defined by an arrangement of the first pixels and the second pixels in the line are provided; and the lines are arrayed in the second direction with a predetermined combination of the plurality of types of line array pattern. Furthermore, preferably, lines that are adjacent to each other in the second direction respectively have types of line array pattern which are different from each other. Also, preferably, a selection circuit that selects lines that have an identical type of line array pattern, among lines that are arrayed with the plurality of types of line array pattern is further provided.

Also, in the above image capturing device, preferably, the plurality of pixels are arrayed two-dimensionally in a first direction and in a second direction perpendicular to the first direction; and the photoelectric conversion portions for photometry of the first pixels that are present in a line extending in the first direction have a common output line. Furthermore, preferably, the output line is common to a reset potential supply line that supplies a reset potential to the first reset portions of the first pixels and the second reset portions of the second pixels that are present in a line extending in the first direction.

Another image capturing device in which a plurality of pixels are two-dimensionally arrayed on one semiconductor substrate, comprises: first pixels each provided with a first photoelectric conversion portion for capturing an image of a subject, a first amplifier portion for amplifying a signal generated at the first photoelectric conversion portion, a first reset portion for resetting the signal generated at the first photoelectric conversion portion and an opening portion for photometry that is formed on at least a part of the first reset portion; and second pixels each provided with a second photoelectric conversion portion for capturing the image of the subject, a second amplifier portion for amplifying a signal generated by the second photoelectric conversion portion and a second reset portion for resetting the signal generated at the second photoelectric conversion portion. Each of the lines in a horizontal scanning direction has the first pixels and the second pixels; a plurality of types of array patterns defined by an arrangement of the first pixels and the second pixels are provided; and in each of the lines that are adjacent to each other in the vertical direction, the first pixels and the second pixels are arrayed with different types of array patterns from each other.

In this image capturing device, preferably, a first type of array pattern having the first pixels provided in a first area in the horizontal scanning direction and a second type of array pattern having the first pixels provided in a second area in the horizontal scanning direction are alternately provided every other line in the vertical scanning direction.

Or, preferably, at least, a first type of array pattern having the first pixels provided in a first area in the horizontal scanning direction, a second type of array pattern having the first pixels provided in a second area in the horizontal scanning direction, a third type of array pattern having the first pixels provided in a third area in the horizontal scanning direction and a fourth type of array pattern having the first pixels provided in a fourth area in the horizontal scanning direction, are provided; and a first photometering area having the first type of array pattern and the second type of array pattern alternately allocated to individual lines or individual pluralities of lines in the vertical scanning direction and a second photometering area having the third type of array pattern and the fourth type of array pattern alternately allocated to individual lines or individual pluralities of lines in the vertical scanning direction, are provided at different locations from each other in the vertical scanning direction.

Also, preferably, a current to voltage converter connected to a reference voltage application terminal of the first reset portion, which converts a level of current at the photoelectric conversion portion for photometry to a voltage level, is provided.

Also, preferably, a switching circuit connected to reference voltage application terminals of the first reset portion and the second reset portion, which switches between application of a reference voltage and extraction of a photometric signal, is provided.

Also, preferably, the first amplifier portion and the second amplifier portion each have a junction-type field effect transistor.

Also, preferably, each of the first pixel and the second pixel has identical semiconductor component elements; and at least a part of semiconductor component elements of the first reset portion and the opening portion form a photoelectric conversion portion for photometry.

Another image capturing device in which a plurality of pixels are arrayed two-dimensionally in a first direction and in a second direction perpendicular to the first direction on one semiconductor substrate, comprises: one or more photometering pixels each provided with a photoelectric conversion portion for capturing an image of a subject, an amplifier portion for amplifying a signal generated at the photoelectric conversion portion, a reset portion for resetting the signal generated at the photoelectric conversion portion and a photoelectric conversion portion for photometry employed for photometering the subject; a plurality of output lines each of which connects outputs of the photoelectric conversion portions for photometry of the photometering pixels that are present in a line extending in the first direction; and a selection circuit that selects predetermined output lines among the plurality of output lines in order to obtain a photometry signal of a predetermined area.

DETAILED DESCRIPTION OF PREFERRED EMBODIMENTS

First Embodiment

The structure and the operation of the image capturing device in this embodiment are shown in FIGS. 1~19.

Figure 1:
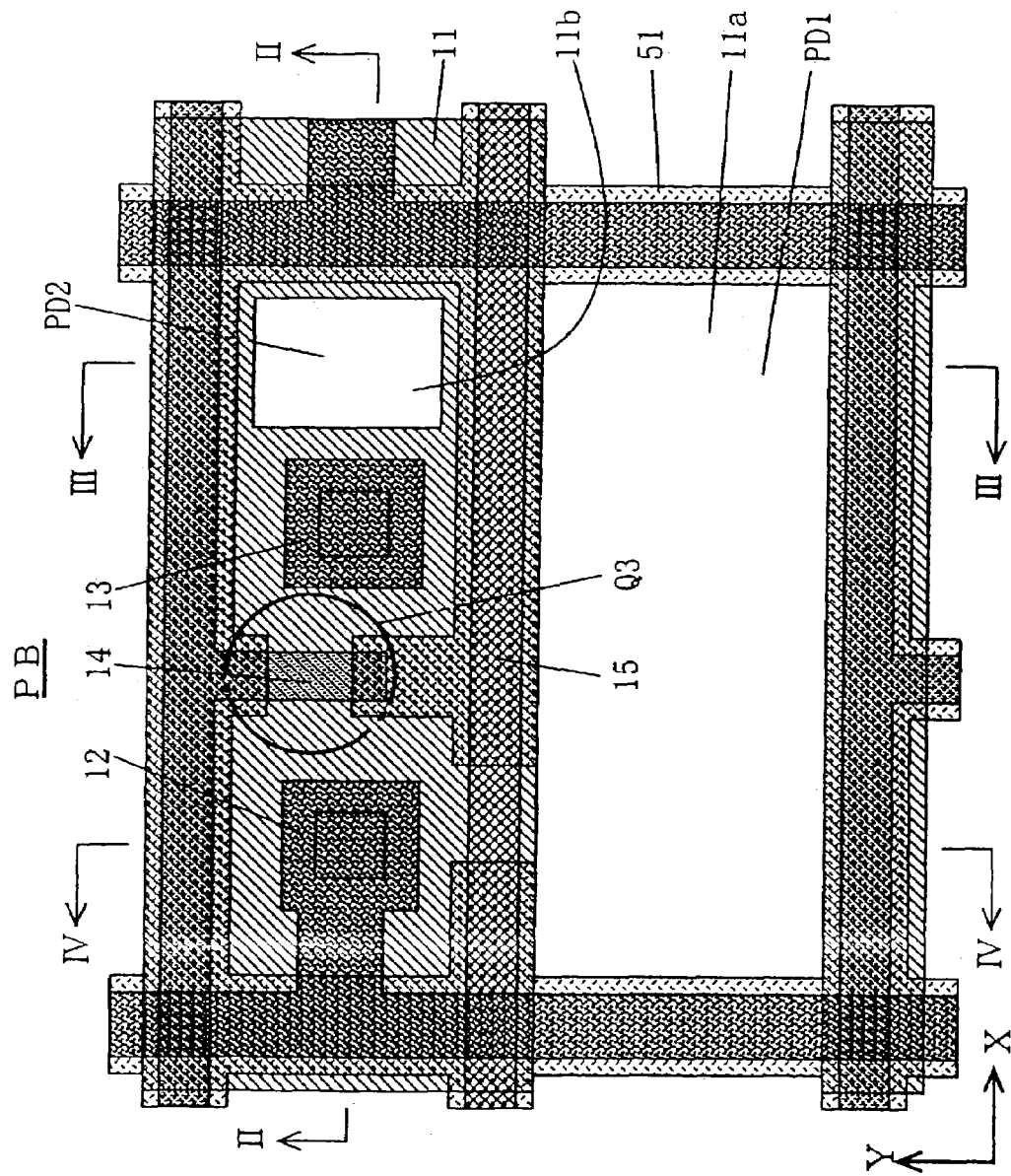
FIG. 1 is a plan view illustrating the structure of a pixel (provided with a photometering function) in an image capturing device.
Figure 2:
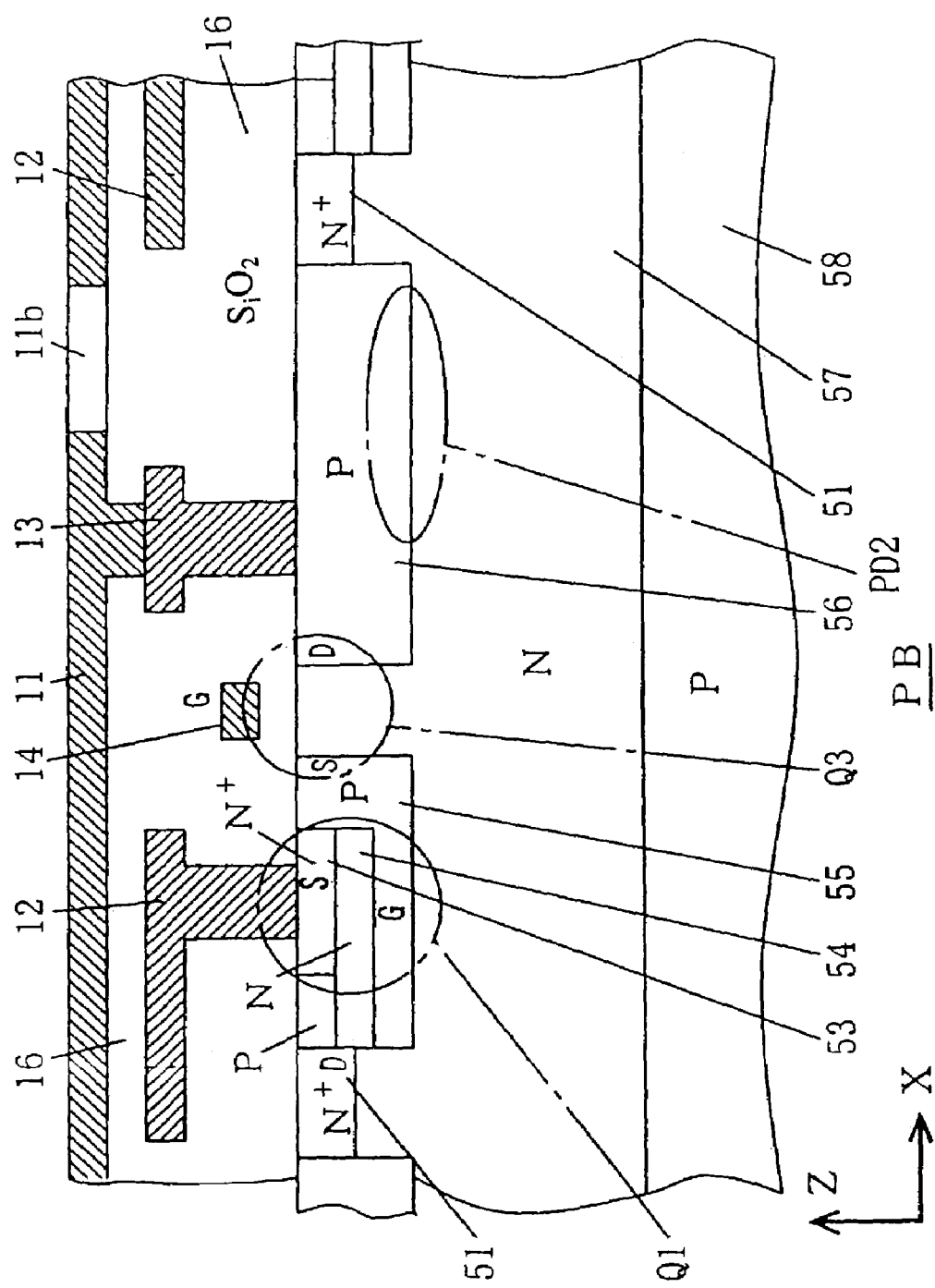
FIG. 2 is a cross section viewed along line II—II in FIG. 1.
Figure 3:
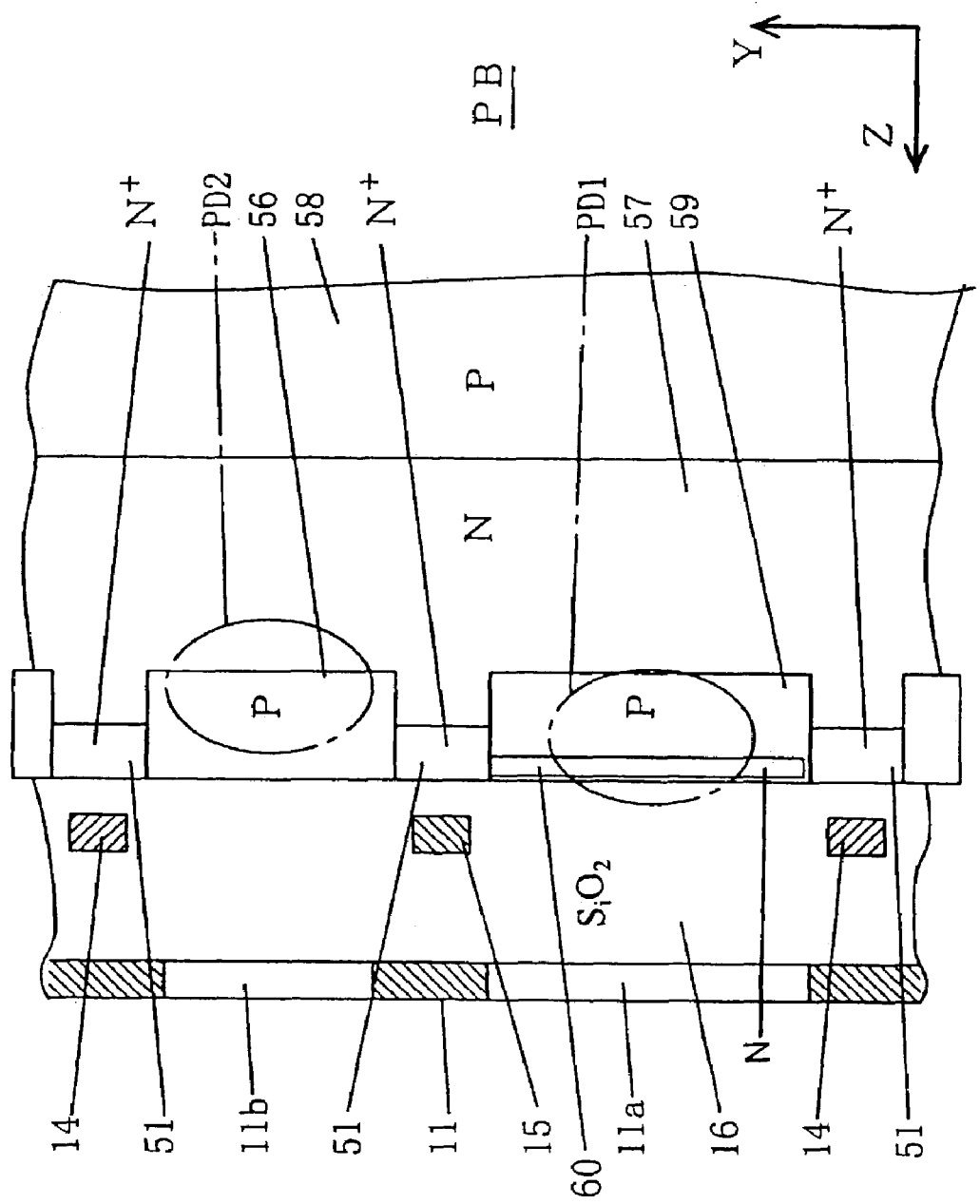
FIG. 3 is a cross section viewed along line III—III in FIG. 1.
Figure 4:
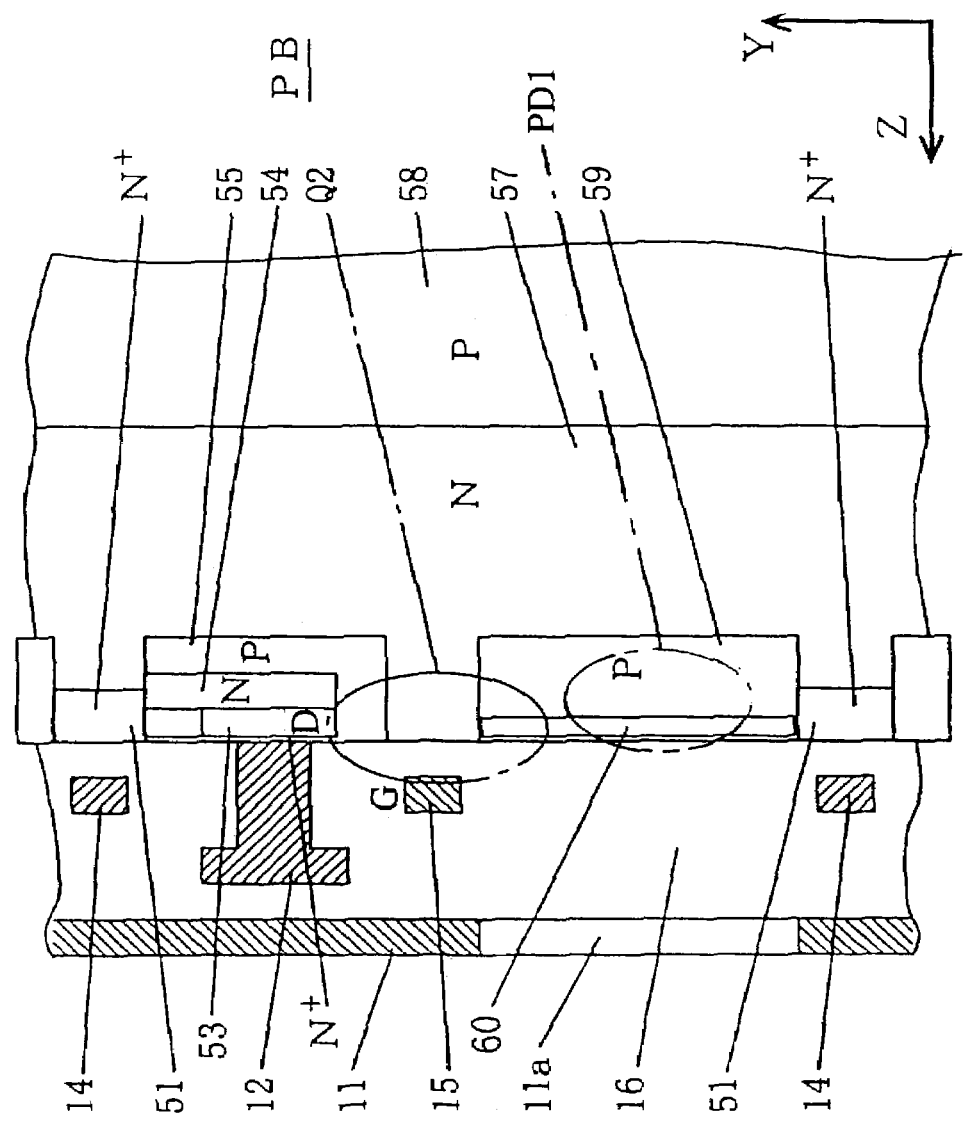
FIG. 4 is a cross section viewed along line IV—IV in FIG. 1.

FIG. 1 is a plan view illustrating the structure of a pixel (provided with a photometering function) in an image capturing device. FIG. 2 is a cross section viewed along line II—II in FIG. 1. FIG. 3 is a cross section viewed along line III—III in FIG. 1. FIG. 4 is a cross section viewed along line IV—IV in FIG. 1.

Figure 5:
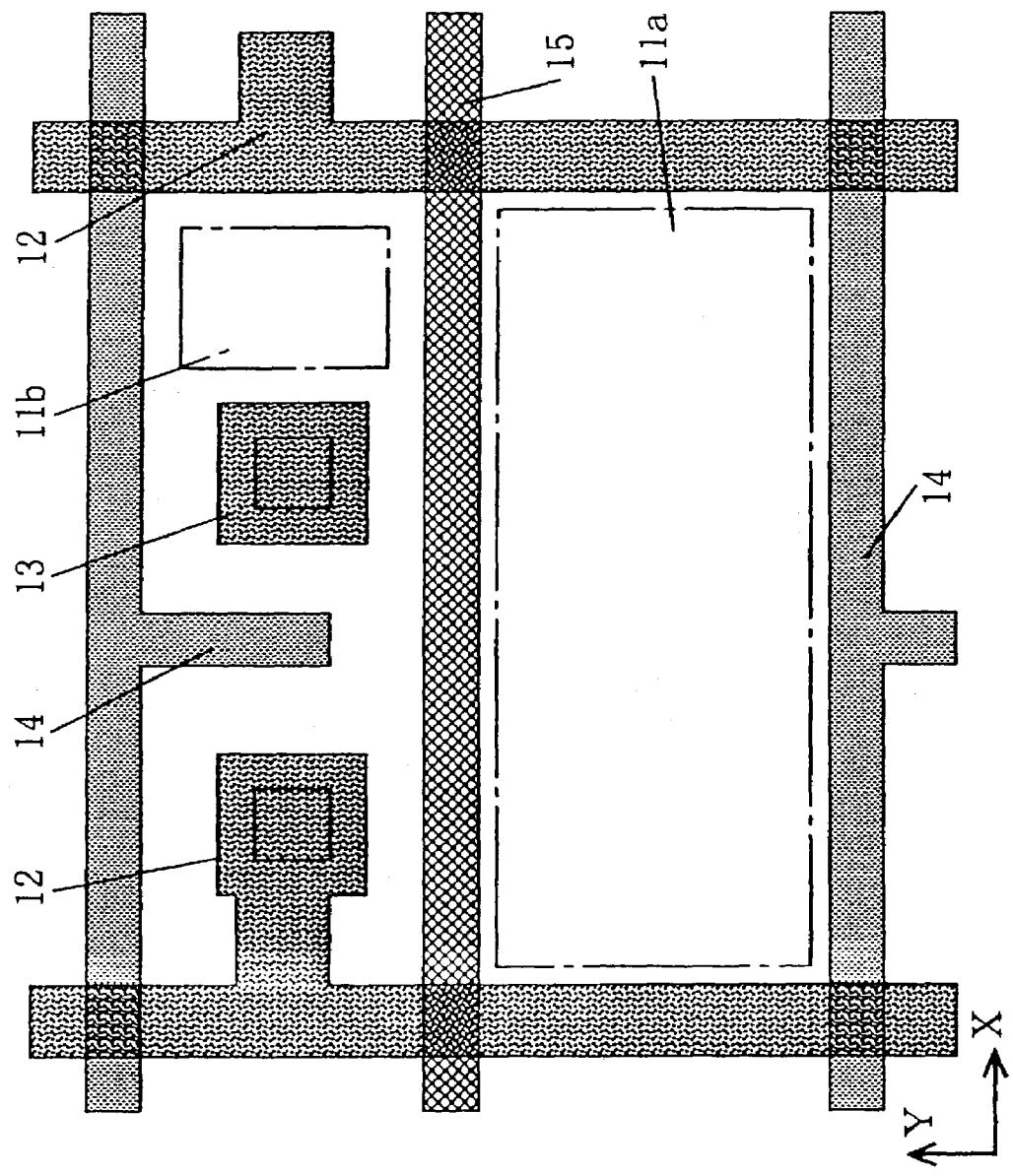
FIG. 5 is a plan view illustrating a specific layer constituting the pixel in FIG. 1.
Figure 6:
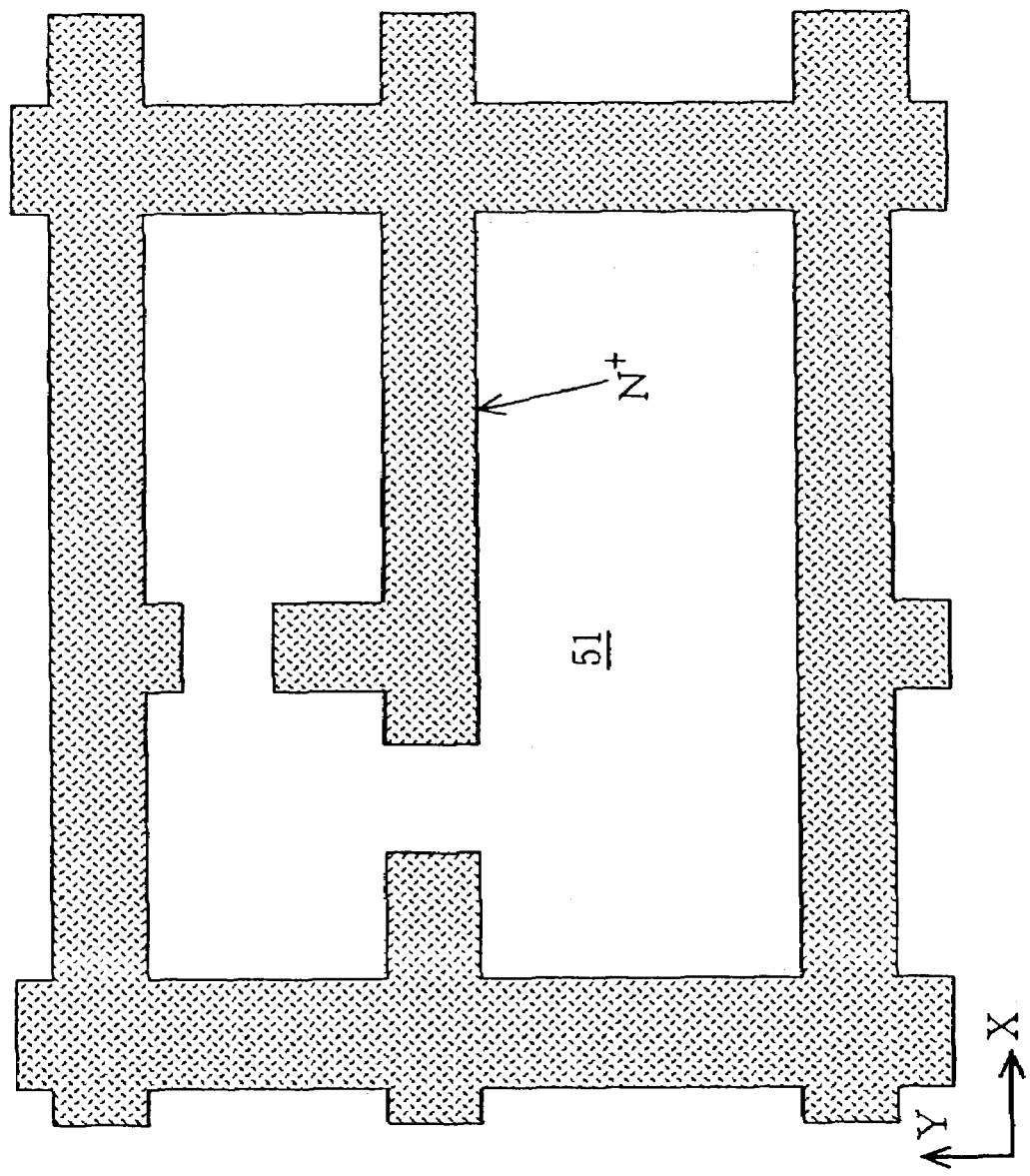
FIG. 6 is a plan view illustrating a specific layer constituting the pixel in FIG. 1.
Figure 7:
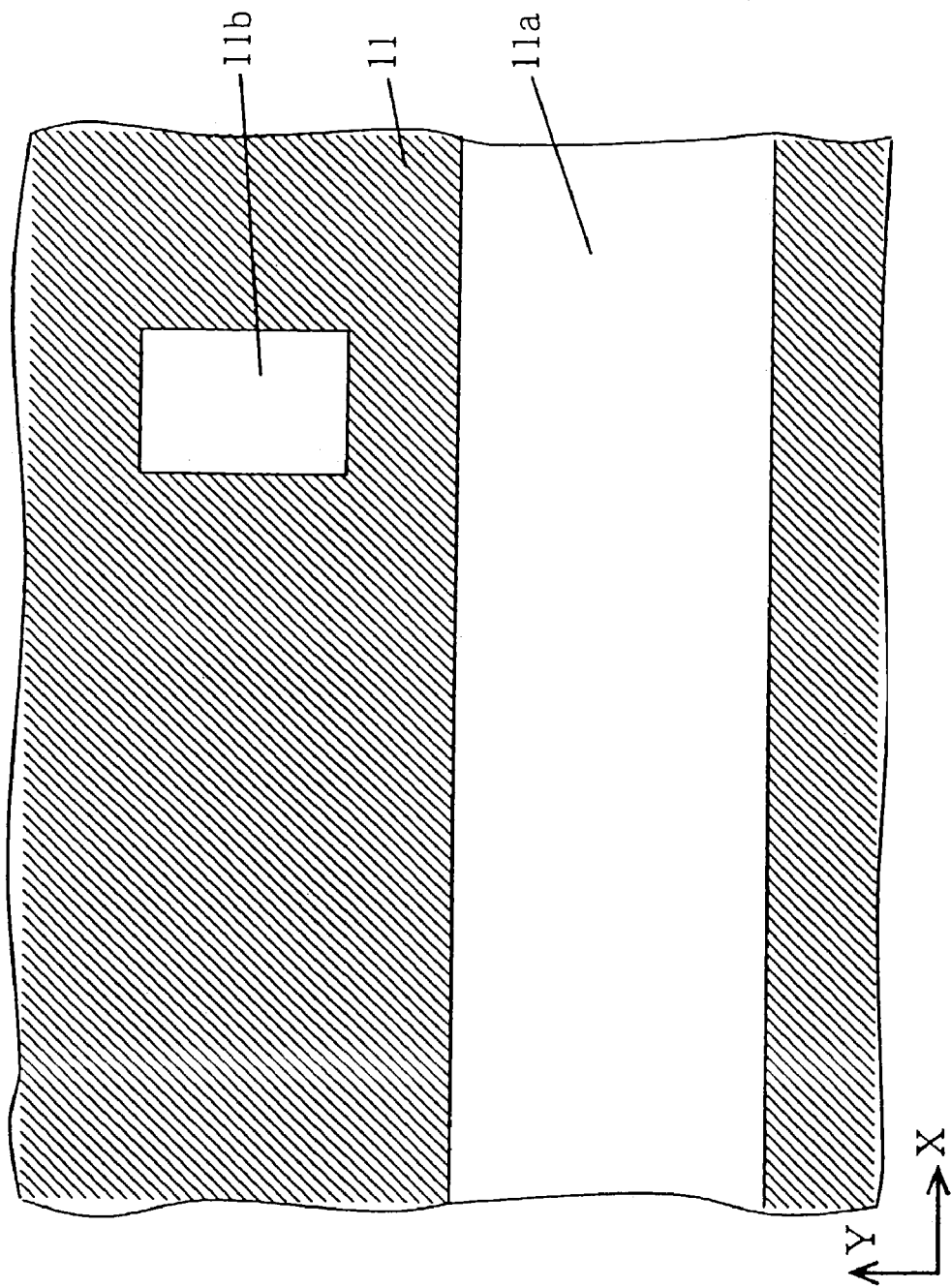
FIG. 7 is a plan view illustrating a specific layer constituting the pixel in FIG. 1.

FIG. 5 is a plan view illustrating a specific layer constituting the pixel in FIG. 1. FIG. 6 is a plan view illustrating a specific layer constituting the pixel in FIG. 1. FIG. 7 is a plan view illustrating a specific layer constituting the pixel in FIG. 1.

Figure 8:
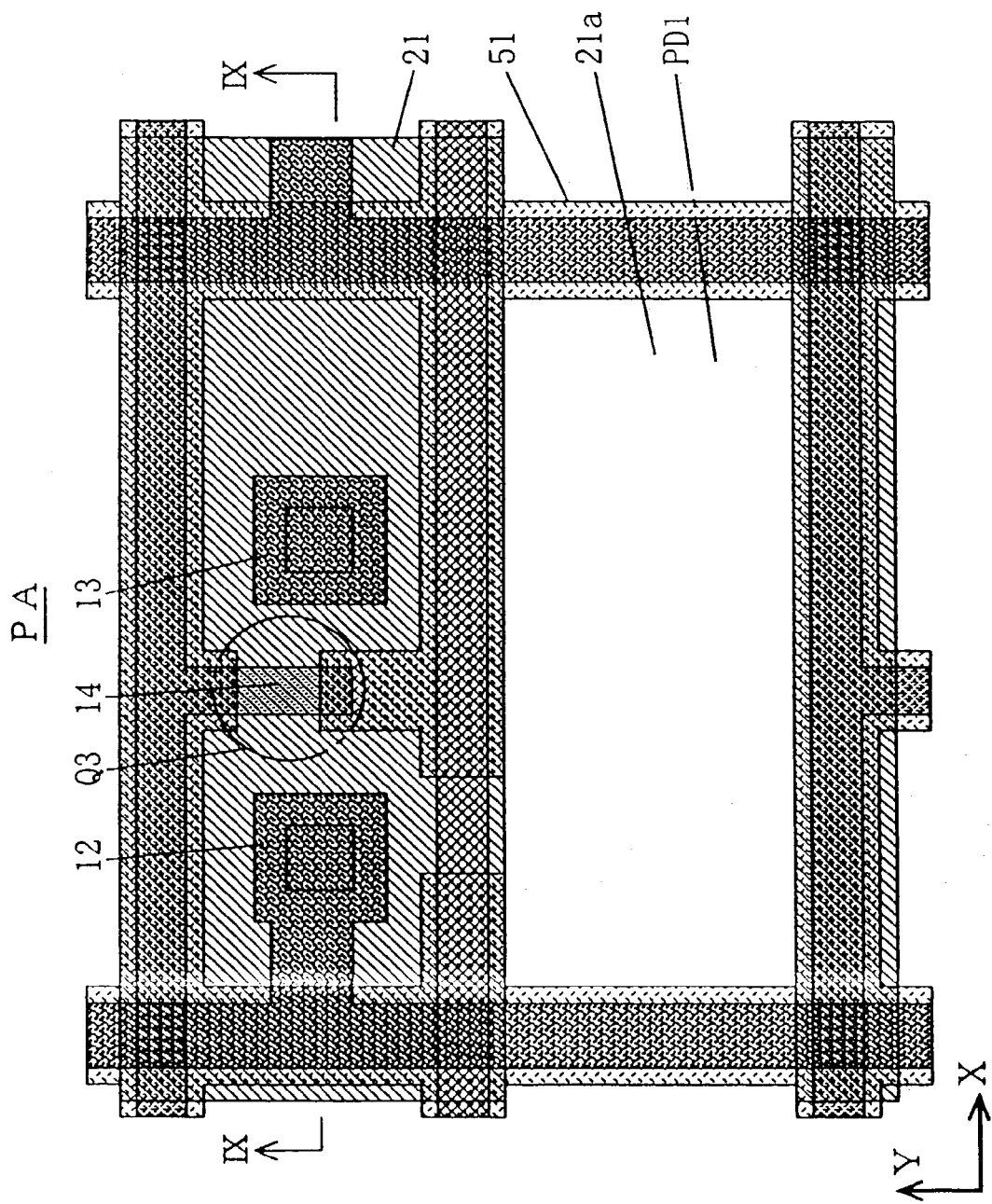
FIG. 8 is a plan view illustrating the structure of a pixel (without the photometering function) in the image capturing device.
Figure 9:
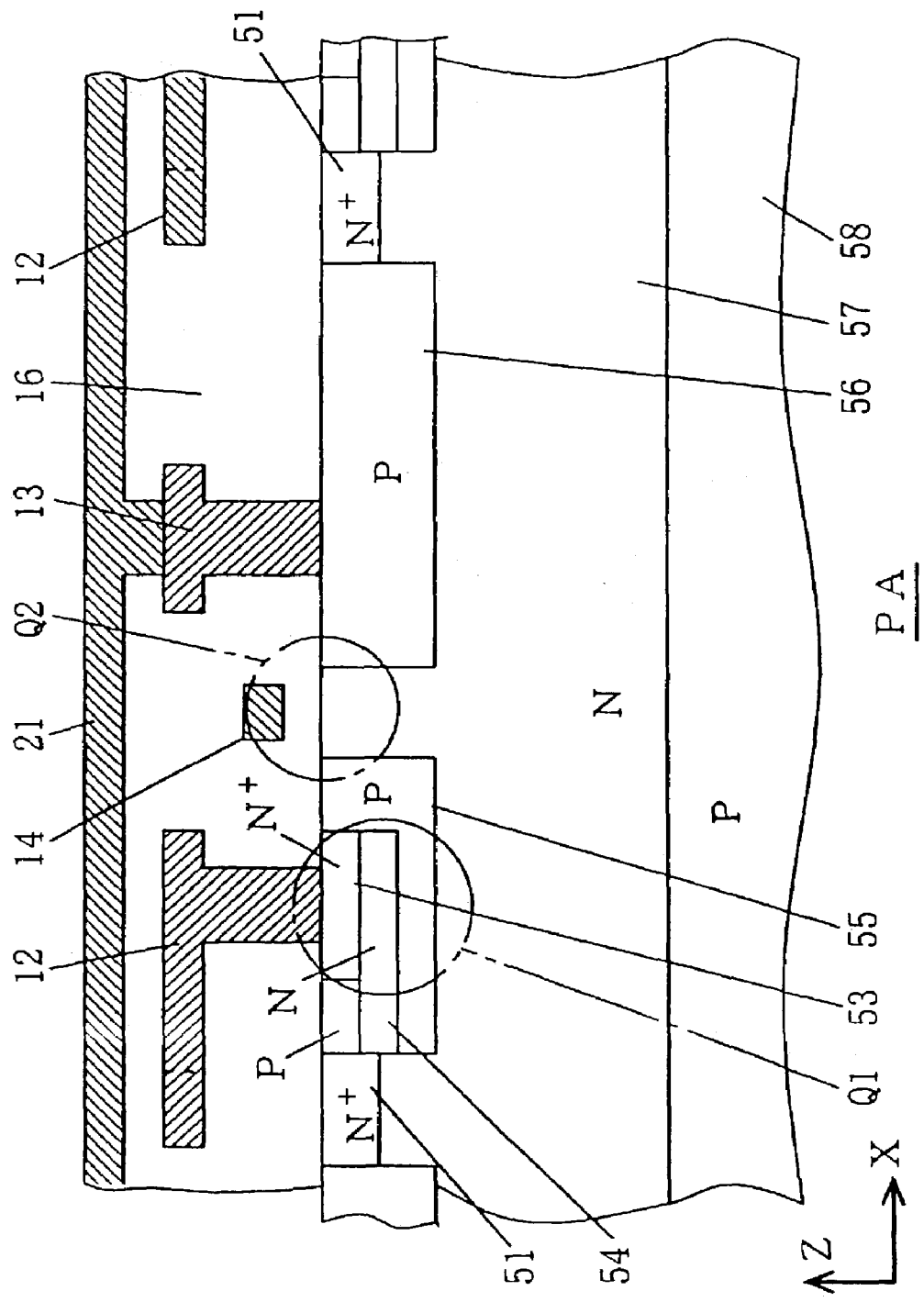
FIG. 9 is a cross section viewed along line IX—IX in FIG. 8.
Figure 10:
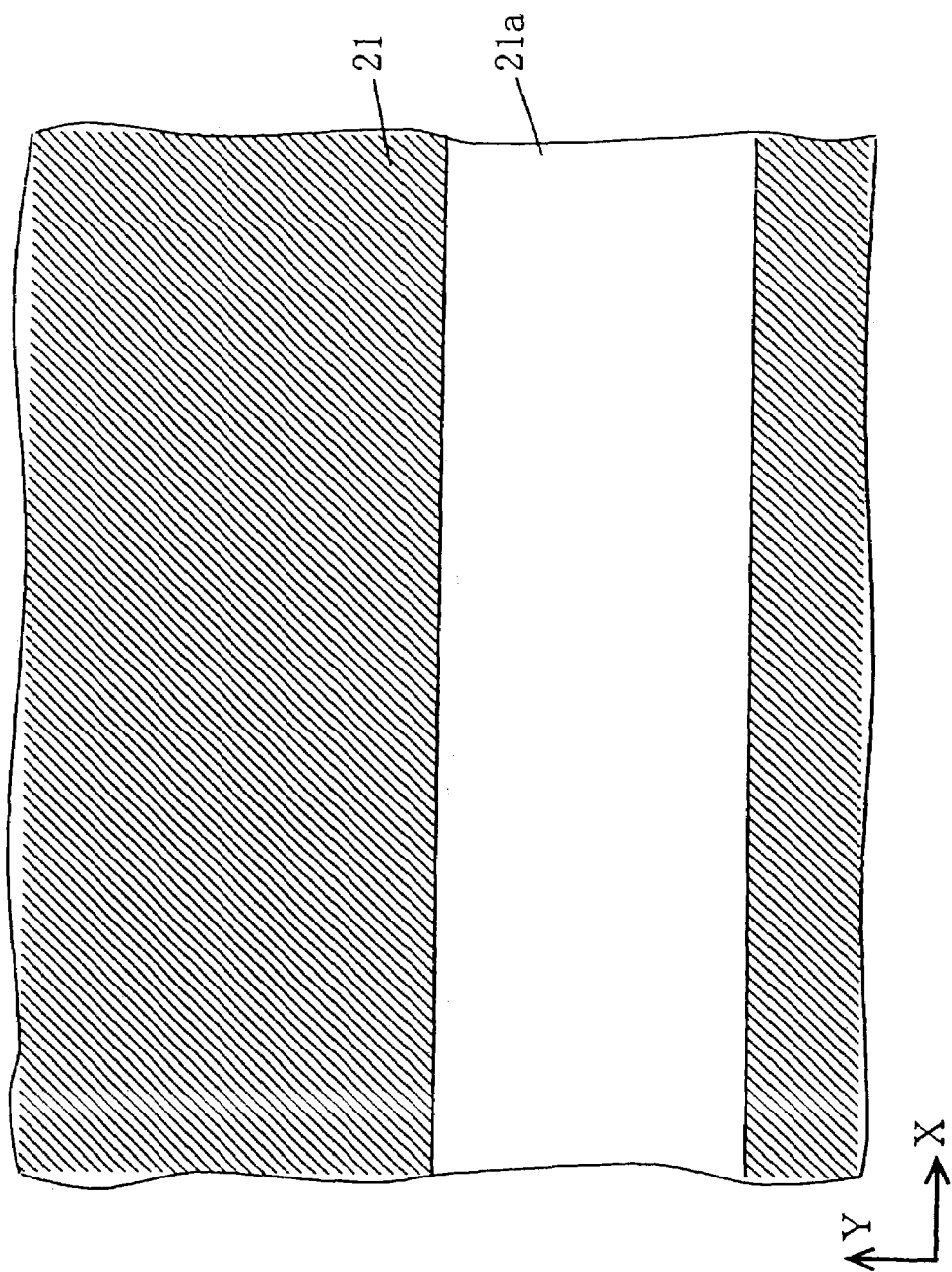
FIG. 10 is a plan view illustrating a specific layer constituting the pixel in FIG. 8.

FIG. 8 is a plan view illustrating the structure of a pixel (without the photometering function) in the image capturing device. FIG. 9 is a cross section viewed along line IX—IX in FIG. 8. FIG. 10 is a plan view illustrating a specific layer constituting the pixel in FIG. 8.

Figure 11:
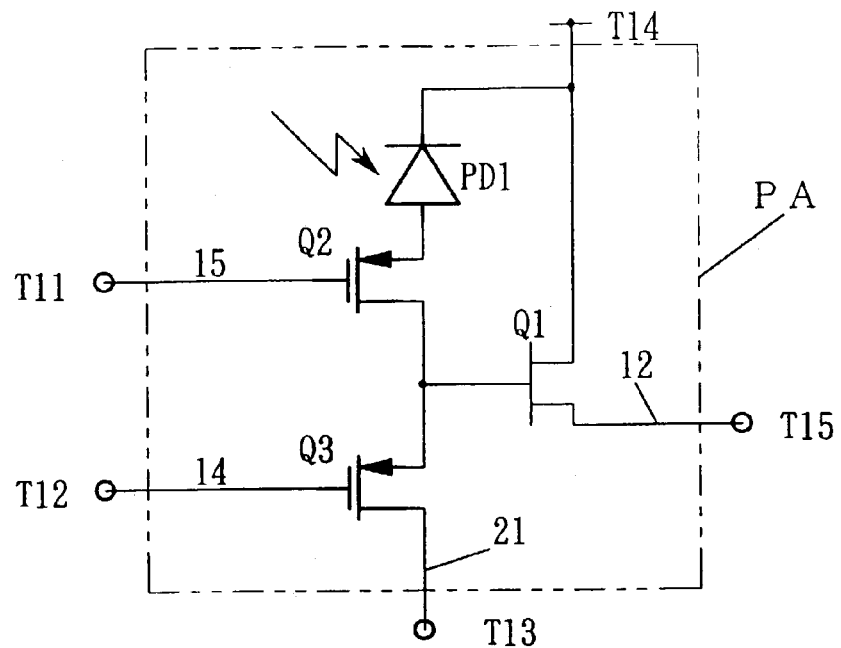
FIG. 11 is an electrical circuit diagram illustrating an equivalent circuit of the pixel in FIG. 8.
Figure 12:
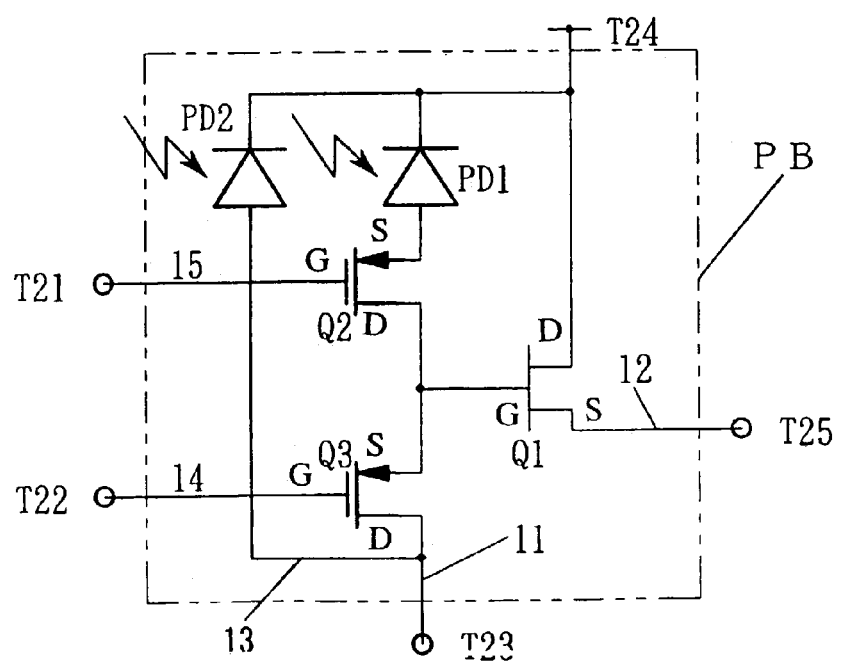
FIG. 12 is an electrical circuit diagram illustrating an equivalent circuit of the pixel in FIG. 1.
Figure 13:
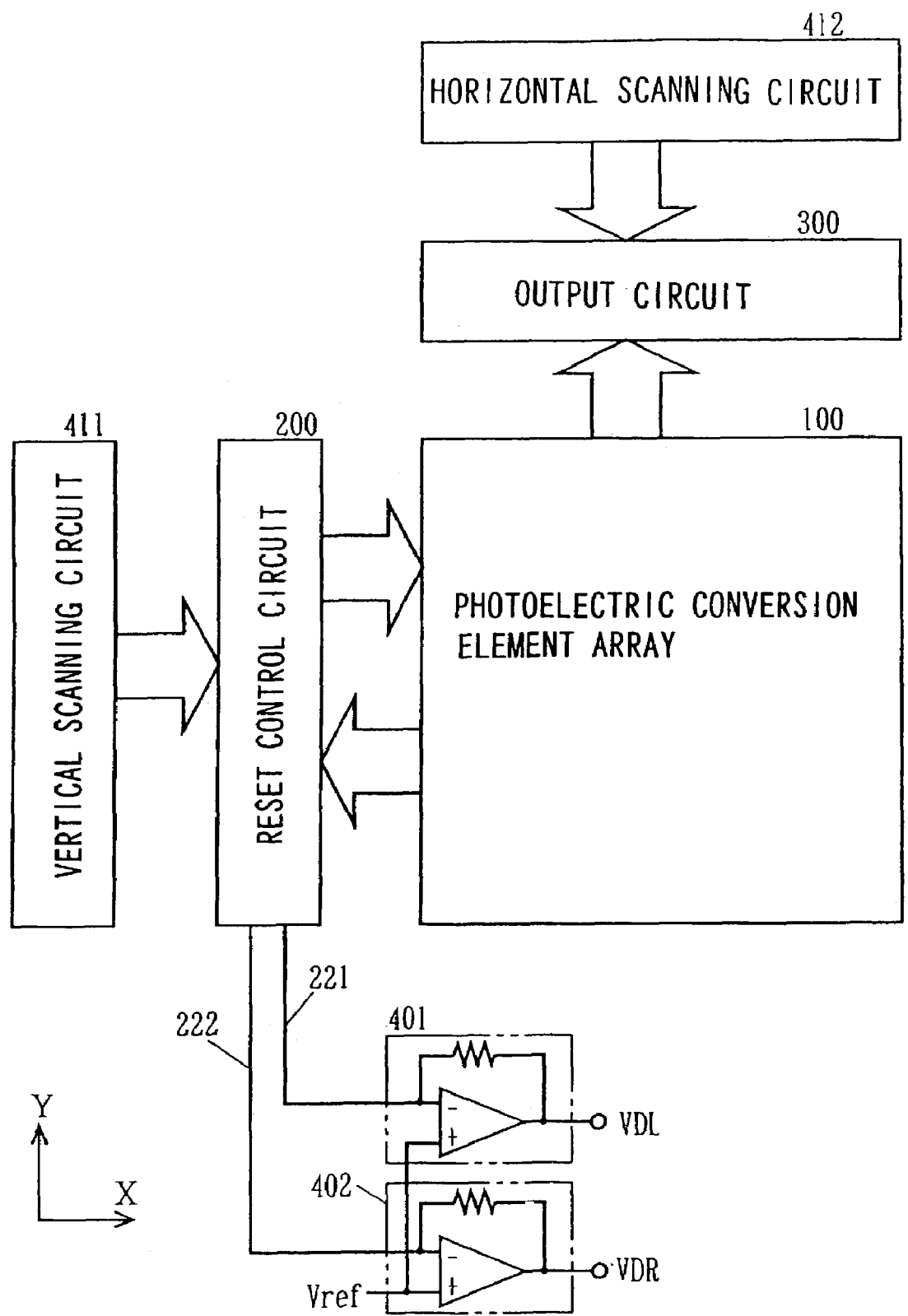
FIG. 13 is a block diagram illustrating the basic structure of the overall image capturing device in a first embodiment.

FIG. 11 is an electrical circuit diagram illustrating an equivalent circuit of the pixel in FIG. 8. FIG. 12 is an electrical circuit diagram illustrating an equivalent circuit of the pixel in FIG. 1. FIG. 13 is a block diagram illustrating the basic structure of the overall image capturing device in a first embodiment.

Figure 14:
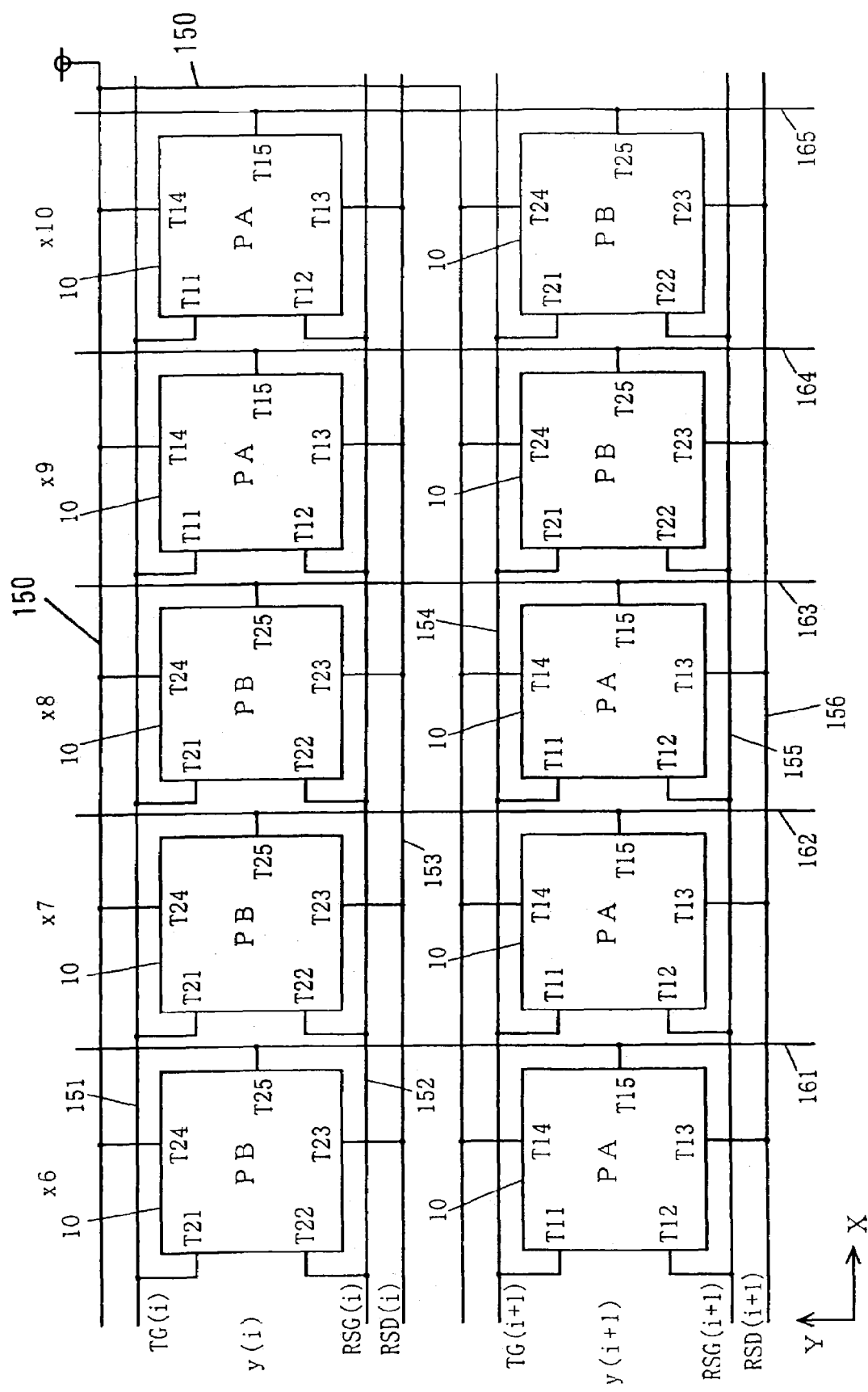
FIG. 14 is a block diagram illustrating a portion of the internal structure of the photoelectric conversion element array 100 in FIG. 13.
Figure 15:
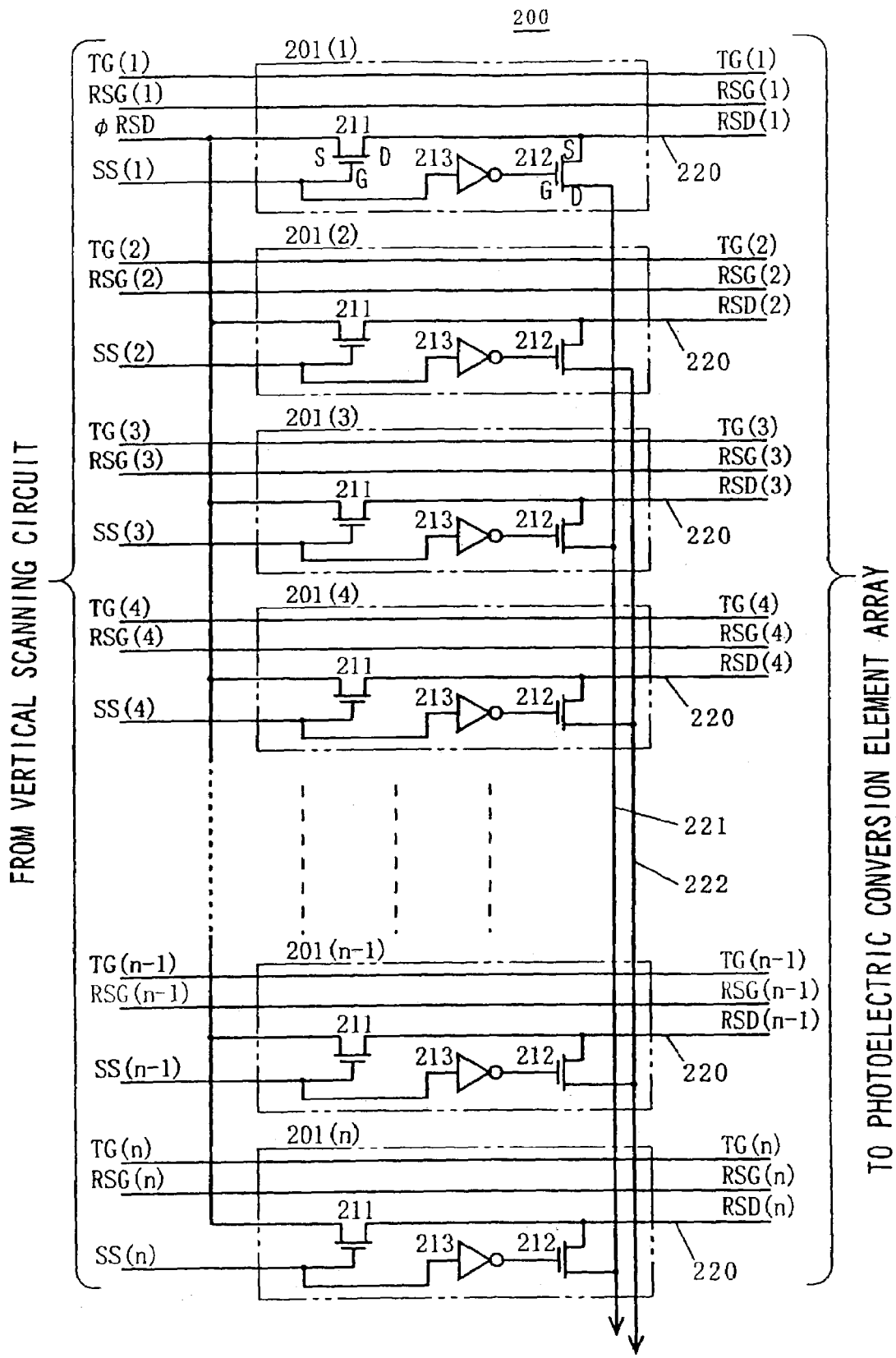
FIG. 15 is a block diagram illustrating the internal structure of the reset control circuit 200 in FIG. 13.
Figure 16:
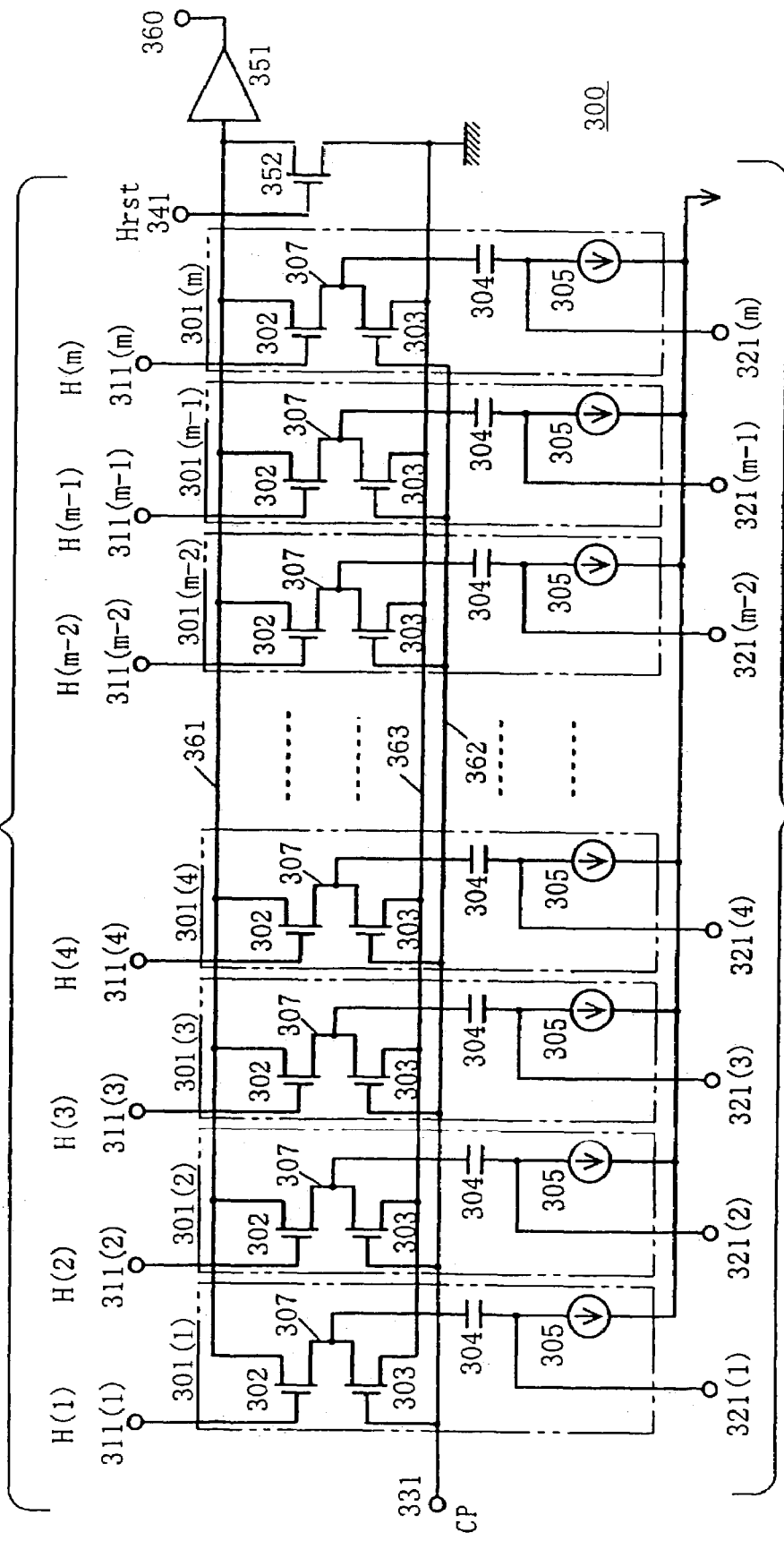
FIG. 16 is a block diagram illustrating the internal structure of the output circuit 300 in FIG. 13.

FIG. 14 is a block diagram illustrating a portion of the internal structure of the photoelectric conversion element array 100 in FIG. 13. FIG. 15 is a block diagram illustrating the internal structure of the reset control circuit 200 in FIG. 13. FIG. 16 is a block diagram illustrating the internal structure of the output circuit 300 in FIG. 13.

Figure 17:
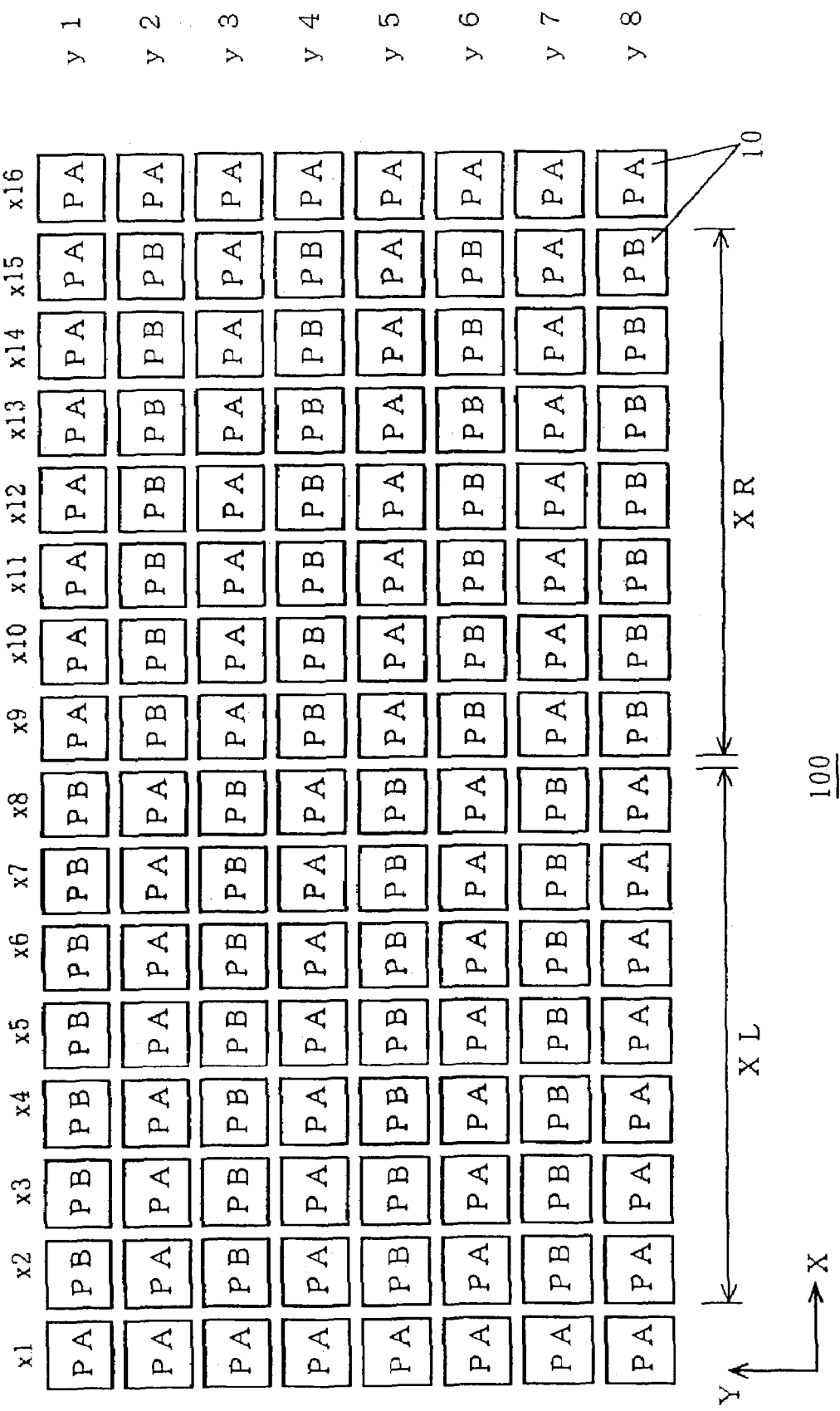
FIG. 17 is a plan view illustrating the arraying patterns of two types of pixels in the photoelectric conversion element array 100 in FIG. 13.
Figure 18:
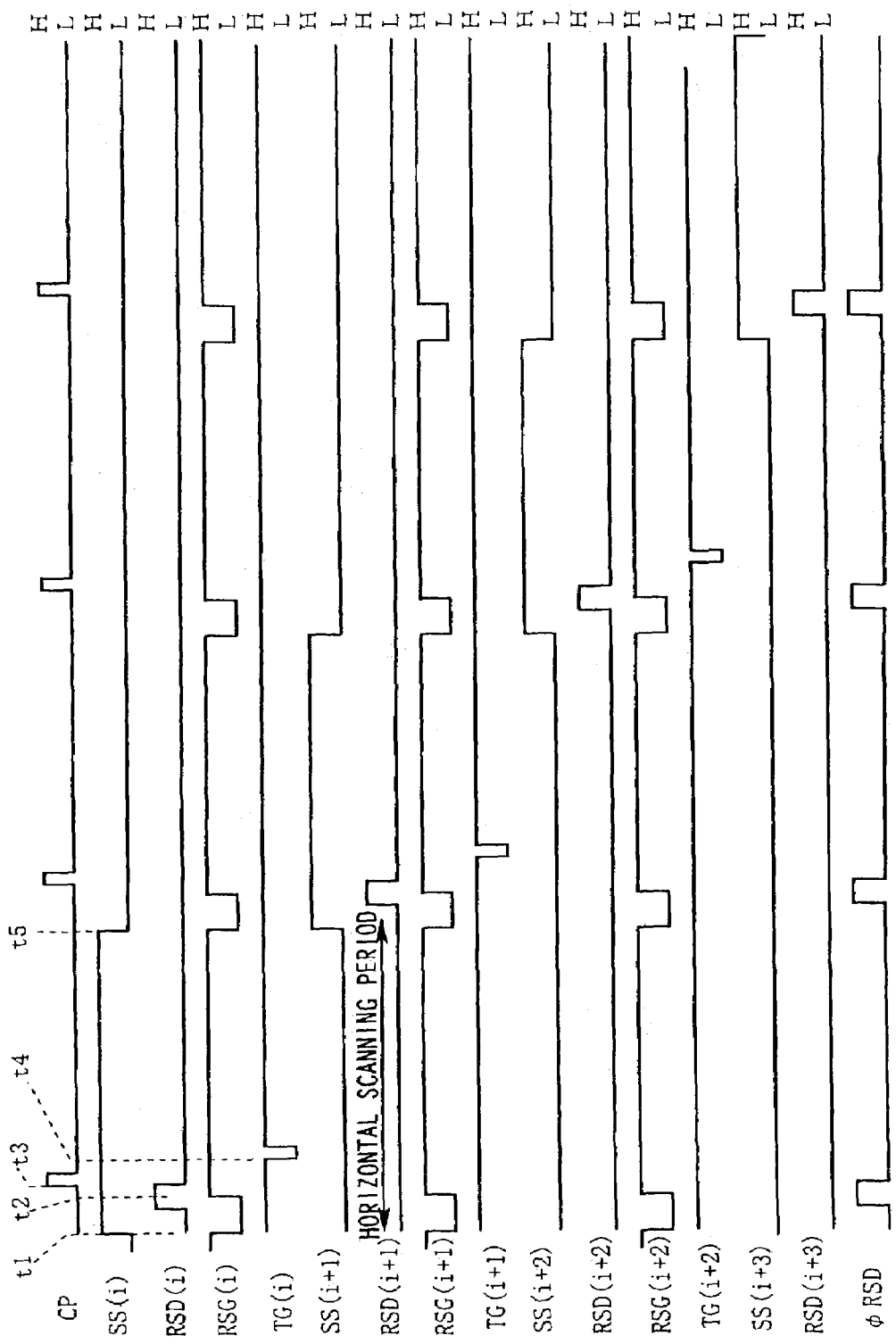
FIG. 18 is a time chart of the operation performed by the image capturing device in FIG. 13.
Figure 19:
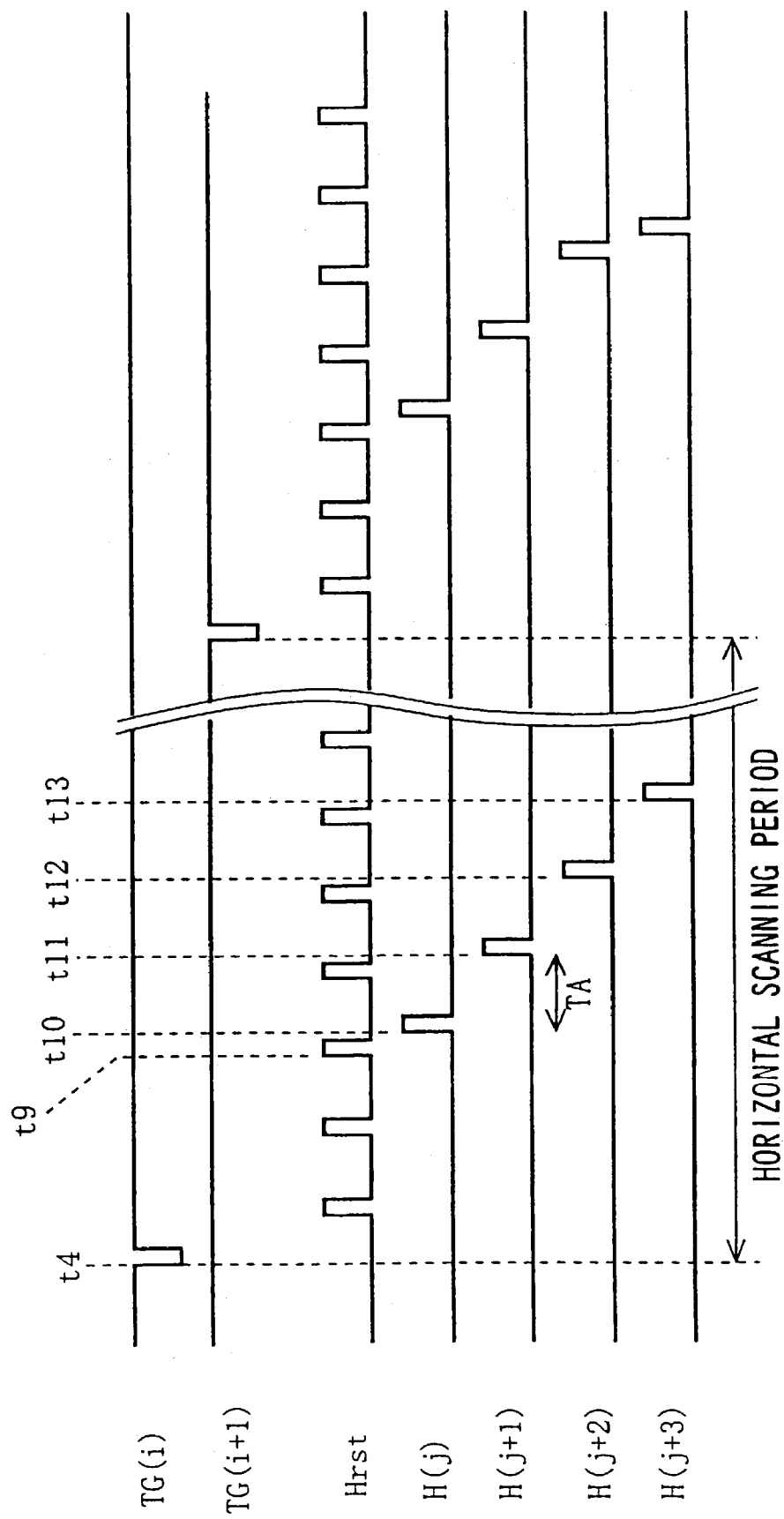
FIG. 19 is a time chart of the operation performed by the image capturing device in FIG. 13.

FIG. 17 is a plan view illustrating the arraying patterns of two types of pixels in the photoelectric conversion element array 100 in FIG. 13. FIG. 18 is a time chart of the operation performed by the image capturing device in FIG. 13. FIG. 19 is a time chart of the operation performed by the image capturing device in FIG. 13.

The image capturing device in the embodiment is structured as illustrated in FIG. 13. A photoelectric conversion element array 100 in the image capturing device comprises a great number of photoelectric conversion cells (pixels) 10 that are arrayed in a regular manner over equal intervals in X direction and Y direction as illustrated in FIG. 17.

As illustrated in FIG. 17, the photoelectric conversion cells 10 in the photoelectric conversion element array 100 include non-photometering pixels PA and photometering pixels PB. Each photometering pixel PB has both a photoelectric converting function for photographing and a photometering function for exposure state detection. The non-photometering pixels PA, on the other hand, only have the photoelectric converting function for photographing and do not have the photometering function.

First, a photometering pixel PB illustrated in FIGS. 1~7 and 12 is explained. It is to be noted that in order to clearly illustrate the positional relationships among the individual components of the photometering pixel PB which is three-dimensionally structured, the portions that are not actually visible are also shown in FIG. 1.

In terms of its functions, the photometering pixel PB comprises a first photodiode PD1, a second photodiode PD2 and transistors Q1~Q3 as illustrated in FIG. 12. The transistor Q1 is a junction-type field effect transistor (JFET). In addition, the transistors Q2 and Q3 are MOS type transistors.

The first photodiode PD1 is employed for photographing images and the second photodiode PD2 is employed for the measurement of the exposure state. The first photodiode PD1 performs photoelectric conversion of the incident light and generates an electrical charge corresponding to the incident light. The electrical charge thus generated is stored or accumulated.

The stored electrical charge generated by the first photodiode PD1 is transferred to an input (gate terminal) of the transistor Q1 via the transistor Q2. The transistor Q1 amplifies the input signal and outputs the amplified signal to an output terminal T25. The transistor Q3 discharges the electrical charge at the input of the transistor Q1. In other words, the transistor Q3 performs a reset operation for initializing the input level at the transistor Q1.

The electrical charge generated by the second photodiode PD2 can be extracted or taken out through a terminal T23. However, when initializing the input level at the transistor Q1, a specific reference voltage is applied to the terminal T23 from the outside.

In reference to FIGS. 2~4 and 12, the photometering pixel PB comprises a reset potential supply electrode 11, a signal output electrode 12, a connection electrode 13, a reset gate control electrode 14, a transfer gate control electrode 15, a transparent insulating portion 16, an N+ type impurity diffusion area 51, an N+ type impurity diffusion area 53, an N type impurity diffusion area 54, a P type impurity diffusion area 55, a P type impurity diffusion area 56, an N type semiconductor layer 57, a P type semiconductor substrate 58, a P type impurity diffusion area 59 and an N type impurity diffusion area 60. These elements are referred to as semiconductor component elements.

On the P type semiconductor substrate 58, a great number of photometering pixels PB and non-photometering pixels PA are formed through a specific semiconductor manufacturing process.

The first photodiode PD1, the second photodiode PD2 and the transistors Q1, Q2 and Q3 constituting a photometering pixel PB are surrounded by a high density N+ type impurity diffusion area 51 per photoelectric conversion cell 10 illustrated in FIG. 6.

The first photodiode PD1 comprises the P type impurity diffusion area 59 formed at the N type semiconductor layer 57 and the high density N type impurity diffusion area 60 as illustrated in FIG. 3. The electrical charge generated by the first photodiode PD1 through exposure is stored at the P type impurity diffusion area 59.

At the surface of the image capturing device, the reset potential supply electrode 11 illustrated in FIGS. 3 and 7 is formed. The reset potential supply electrode 11, which is constituted of a metal film (aluminum in this example) has a light-blocking property.

However, in the area facing the first photodiode PD1, an opening portion 11a is formed at the reset potential supply electrode 11. The transparent insulating portion (e.g., $SiO_2$)

16 present in the space between the first photodiode PD1 and the opening portion 11a transmits light.

As a result, incident light that comes in from the left side in FIG. 3 (from above in FIG. 2) enters the first photodiode PD1 via the opening portion 11a and the transparent insulating portion 16.

The second photodiode PD2 comprises the P type impurity diffusion area 56 and the N type semiconductor layer 57, as illustrated in FIGS. 2 and 3. At the light-blocking reset potential supply electrode 11 formed at the surface of the image capturing device, an opening portion 11b is formed at a position facing the second photodiode PD2.

Thus, the incident light coming in from above in FIG. 2 enters the second photodiode PD2 via the opening portion 11b and the transparent insulating portion 16. The second photodiode PD2 performs photoelectric conversion of the incident light and generates the electrical charge corresponding to the intensity of the incident light.

The transistor Q2 which is employed for charge transfer comprises the N type impurity diffusion area 60 which constitutes a source area, the N+ type impurity diffusion area 53 which constitutes a drain area and the transfer gate control electrode 15 which constitute a gate area, as illustrated in FIG. 4. The transfer gate control electrode 15 is constituted of polysilicon.

The electrical charge stored at the first photodiode PD1 is transferred to the gate area of the transistor Q1 via the transistor Q2. On/off control of the transistor Q2 is achieved by the voltage applied to the transfer gate control electrode 15.

The transistor Q1 which is employed for amplification comprises the P type impurity diffusion area 55 which constitutes a gate area, the N+ type impurity diffusion area 53 which constitutes a source area, the N type impurity diffusion area 54 which constitutes a channel area and the N+ type impurity diffusion area 51 which constitutes a drain area, as illustrated in FIG. 2.

The N+ type impurity diffusion area 53 and the N type impurity diffusion area 54 are formed on the inside of the P type impurity diffusion area 55. The N+ type impurity diffusion area 53 constituting the source area of the transistor Q1 is electrically connected with the signal output electrode 12. The signal output electrode 12 is constituted of a metal (aluminum in this example).

The signal which is amplified by the transistor Q1 (the 25 stored electrical charge at the first photodiode PD1) is extracted through the signal output electrode 12.

The transistor Q3 which is employed for reset control comprises the P type impurity diffusion area 55 which constitutes a source area, the P type impurity diffusion area 56 which constitutes a drain area, the reset gate control electrode 14 which constitutes a gate area and the N type semiconductor layer 57 which constitutes a channel area, as illustrated in FIG. 2. These P type impurity diffusion area 56 and N type semiconductor layer 57 are common to semiconductor component elements of the second photodiode mentioned above. In other words, the semiconductor component elements of the reset transistor Q1 are partially common to or shared with the semiconductor component elements of the second photodiode.

The reset gate control electrode 14 is constituted of polysilicon. The P type impurity diffusion area 56 constituting the drain area of the transistor Q3 is electrically connected with the reset potential supply electrode 11 via the connection electrode 13. The connection electrode 13 is constituted of metal (aluminum in this example).

On/off control of the transistor Q3 is achieved by applying a voltage to the reset gate control electrode 14. When the transistor Q3 is set in an on state, a specific reference voltage can be applied to the input terminal (gate area) of the transistor Q1 via the reset potential supply electrode 11. Since the input level at the transistor Q1 is thus initialized, the dark signal level is set.

In addition, the electrical charge generated at the second photodiode PD2 is output to the reset potential supply electrode 11. When the transistor Q3 is in an off state, the signal output by the second photodiode PD2 (the photometric signal indicating the exposure state of the photometering pixel PB) can be extracted through the reset potential supply electrode 11.

FIG. 8 is a plan view illustrating the structure of a non-photometering pixel PA. FIG. 9 is a cross section of FIG. 8 viewed along line IX—IX. FIG. 10 is a plan view illustrating the layer constituting a reset potential supply electrode 21 of the non-photometering pixel PA. The structural difference between the photometering pixel PB and the non-photometering pixel PA is slight. As illustrated in FIG. 7, the opening portions 11a and 11b are provided at the reset potential supply electrode 11 of the photometering pixel PB. At the reset potential supply electrode 21 of the non-photometering pixel PA, on the other hand, only an opening portion 21a is present, as illustrated in FIG. 10.

Thus, the non-photometering pixel PA does not have any function that corresponds to that achieved by the second photodiode PD2 in the photometering pixel PB. While semiconductor component elements that correspond to the second photodiode PD2 in FIG. 2 are present as parasitic elements of the P type impurity diffusion area 56 which corresponds to the drain of the reset transistor Q3 and the like in FIG. 9, it does not function as a photodiode since there is no opening portion 11b and, therefore, no electrical charge is generated or stored through photoelectric conversion. In other words, it can be selected by opening a part of the reset transistor Q3 or not opening the part whether the second photodiode PD2 is formed or not. Accordingly, only the photometering pixels PB output photometric signals indicating the exposure state of the photoelectric conversion cells 10. Thus, this embodiment facilitates design of two types of elements, i.e., the photometering elements PB and the non-photometering elements PA simply by altering the layer constituting the reset potential supply electrode. It is to be noted that the first photodiode PD1 of the non-photometering pixel PA and the first photodiode PD1 of the photometering pixel PB have essentially the same photoelectric conversion characteristics.

As illustrated in FIG. 17, the great number of photoelectric conversion cells 10 constituting the photoelectric conversion element array 100 include the non-photometering pixels PA and the photometering pixels PB. It is to be noted that FIG. 17 only shows some of the great number of photoelectric conversion cells 10 that are actually included in the photoelectric conversion element array 100.

To perform a photographing operation, the great number of photoelectric conversion cells 10 included in the photoelectric conversion element array 100 are horizontally scanned in the direction along the X axis and vertically scanned in the direction along the Y axis. In this context, the photoelectric conversion cells 10 arrayed along one line in the direction of the X axis are referred to as a scanning line.

In FIG. 17, at each of the scanning lines at positions y1, y3, y5 and y7 in the direction of the Y axis, the photometering pixels PB are provided over a range XL at x2~x8 in the direction of the X axis, with the non-photometering pixels PA provided at other positions. In addition, at the scanning lines at positions y2, y4, y6 and y8 in the direction of the Y axis, the photometering pixels PB are provided over a range XR at x9~x15 in the direction of the X axis and the non-photometering pixels PA are provided at other positions.

At the scanning lines at y1, y3, y5 and y7 in the direction of the Y axis, the non-photometering pixels PA and the photometering pixels PB are arrayed in the direction of the X axis achieving identical array patterns, i.e., a first array pattern. An array pattern is also called as a line array patter. In addition, at the scanning lines at y2, y4, y6 and y8 in the direction of the Y axis, the non-photometering pixels PA and the photometering pixels PB are arrayed in the direction of the X axis achieving an identical array pattern, i.e., a second array pattern.

In other words, at the photoelectric conversion element array 100, the non-photometering pixels PA and the photometering pixels PB are arrayed two-dimensionally so that the first array pattern and the second array pattern alternate at every other scanning line.

Since the photometering pixels PB are provided over the range XL at the scanning lines at y1, y3, y5 and y7 in the direction of the Y axis, the intensity of the incident light within the range XL in the direction of the X axis can be detected as a photometric signal. In addition, since the photometering pixels PB are provided over the range XR at the scanning lines at y2, y4, y6 and y8 in the direction of the Y axis, the intensity of the incident light within the range XR in the direction of the X axis can be detected as a photometric signal.

The photometric signals output from the photometering pixels PB can be extracted independently at the individual scanning lines, as detailed later. Consequently, when the scanning line at which the photometric signal is extracted is switched to an adjacent scanning line, the area along the direction of the X axis, which is to be the object of photometry, is switched to the range XL or the range XR.

The electrical circuit of the photoelectric conversion element array 100 is structured as illustrated in FIG. 14. FIG. 14 shows that at the scanning line at a position indicated as y(i), terminals T21(T11), T22(T12), T23(T13) and T24(T14) of the great number of individual photoelectric conversion cells 10 are commonly connected with horizontal connection lines 151, 152, 153 and 150 respectively.

Since the terminals T23 at which the photometric signals of the photometering pixels PB are connected with the horizontal connection line 153 which is shared by the entire scanning line, as illustrated in FIG. 14, the photometric signals cannot be extracted separately from the individual photometering pixels PB. The photometric signals output by the individual photometering pixels PB are added together on the horizontal connection line 153.

At all the scanning lines, output terminals T25(T15) of the photoelectric conversion cells 10 at the positions x6, x7, x8, x9 and x10 in the direction of the X axis are connected to vertical connection lines 161, 162, 163, 164 and 165 respectively. The output terminals T25(T15) of the photoelectric conversion cells 10 can be selected independently for the individual scanning lines by the horizontal connection line 151 and the horizontal connection line 152.

As a result, the signals generated by the first photodiodes PD1 provided at the individual photoelectric conversion cells 10 can be extracted independently from the individual photoelectric conversion cells 10 via the vertical connection lines 161, 162, 163, 164 and 165.

In addition, at the scanning line at a position indicated as y(i+1), the terminals T21(T11), T22(T12), T23(T13) and T24(T14) of the great number of individual photoelectric conversion cells 10 are commonly connected with horizontal connection lines 154, 155, 156 and 150 respectively.

The horizontal connection lines 153, 156, . . . to which the terminals T23 of the photometering pixels PB are connected are provided independently for individual scanning lines. As a result, the photometric signals can be separately extracted through the individual scanning lines.

The horizontal connection lines 151, 152, 153, 154, 155, 156, . . . of the photoelectric conversion element array 100 are connected with a reset control circuit 200 which is shown in FIG. 13. The electrical circuit of the reset control circuit 200 is configured as illustrated in FIG. 15.

As illustrated in FIG. 15, the reset control circuit 200 comprises a great number of switching circuits 201. In FIG. 15, each of the plurality of switching circuits 201 is identified by adding the number assigned to the corresponding scanning line (1~n) in parentheses to the switching circuit reference number 201. Likewise, each signal is identified by adding the number assigned to the corresponding scanning line (1~n) in parentheses.

In the following explanation, the numbers assigned to the scanning lines will be omitted and only the reference numbers assigned to the individual elements will be used unless it is specifically required to indicate the scanning line numbers.

Each switching circuit 201 comprises transistors 211 and 212 and an inverter 213. At the gate terminal of one of the transistors, i.e., the transistor 211, a control signal SS is applied. At the gate terminal of the other transistor 212, a signal achieved by inverting the control signal SS via the inverter 213 is applied.

When the control signal SS is at high H, the transistor 211 is turned on and the transistor 212 is turned off. When the control signal SS is at low L, the transistor 211 is turned off and the transistor 212 is turned on.

A reset voltage signal 0 RSD is applied by a vertical scanning circuit 411 to the source terminal of the transistor 211. The drain terminal of the transistor 211 is connected with a signal line 220. The signal line 220 is connected with the terminals T23(T13) of the individual photoelectric conversion cells 10 in the photoelectric conversion element array 100 via the horizontal connection lines (153, 156 . . . ).

The source terminal of the transistor 212 is connected with the signal line 220. The drain terminal of the transistor 212 is connected with either a common line 221 or a common line 222.

The drain terminals of the transistors 212 at the switching circuits 201(1), 201(3), 201(5), . . . with odd scanning line numbers are connected with the common line 221. The drain terminals of the transistors 212 at the switching circuits 201(2), 201(4), 201(6), . . . with even scanning line numbers, on the other hand, are connected with the common line 222.

When the transistor 211 is turned on and the transistor 212 is turned off, the reset voltage signal 0RSD is applied to the photoelectric conversion cell 10 (PA, PB) as a signal RSD.

When the transistor 212 is turned on and the transistor 211 is turned off, the photometric signal (RSD) output from the photometering pixel PB is output to the common line 221 or 222 via the transistor 212.

The photometric signals output from the photometering pixels PB included at the scanning lines having odd-numbers (y1, y3, y5, . . . ) emerge at the common line 221. The photometric signals at the plurality of scanning lines with odd-numbers are added together on the common line 221.

At the scanning lines having odd-numbers (y1, y3, y5, . . . ), the photometering pixels PB are provided over the range XL in the direction of the X axis as shown in FIG. 17. Thus, the level (current) of the photometric signal emerging at the common line 221 corresponds to the average intensity of the incident light within the range XL in the direction of the X axis.

In addition, the photometric signals output from the photometering pixels PB included at the scanning lines having even-numbers (y2, y4, y6, . . . ) emerge at the common line 222. The photometric signals at the plurality of scanning lines with even-numbers are added together on the common line 222.

At the scanning lines having even-numbers (y2, y4, y6, . . . ), the photometering pixels PB are provided over the range XR in the direction of the X axis as shown in FIG. 17. Thus, the level (current) of the photometric signal emerging at the common line 222 corresponds to the average intensity of the incident light within the range XR in the direction of the X axis.

As illustrated in FIG. 13, the common lines 221 and 222 at the reset control circuit 200 are connected with current to voltage converters 401 and 402 respectively. The current to voltage converter 401 generates a signal voltage VDL which is in proportion to the current flowing through the common line 221. The current to voltage converter 402 generates a signal voltage VDR which is in proportion to the current flowing through the common line 222.

The signal voltage VDL output by the current to voltage converter 401 corresponds to the average intensity of the incident light within the range XL in the direction of the X axis. In addition, the signal voltage VDR output by the current to voltage converter 402 corresponds to the average intensity of the incident light within the range XR in the direction of the X axis.

The input impedances of the current to voltage converters 401 and 402 are extremely small. Consequently, even if the current levels of the photometric signals emerging at the common lines 221 and 222 fluctuate, the voltages at the common lines 221 and 222 hardly change.

Thus, the potentials at the terminals T23(T13) of the individual photoelectric conversion cells 10 are free from the influence of the second photodiodes PD2 at the photometering pixels PB. As a result, this image capturing device is capable of performing an operation of photographing the subject independently of its photometering operation.

The vertical connection lines 161, 162, 163 . . . in the photoelectric conversion element array 100 illustrated in FIG. 14 are connected with an output circuit 300.

FIG. 16 illustrates the specific structure of the output circuit 300. In FIG. 16, the output circuit 300 comprises a great number of signal read circuits 301, an amplifier 351 and a transistor 352. In FIG. 16, each of the plurality of signal read circuits 301 is identified by adding the corresponding scanning column number (1~m) in parentheses to the signal read circuit reference number 301. Likewise, each signal is identified by adding the scanning column number (1~m).

In the following explanation, the scanning column numbers are omitted and only the reference numbers assigned to the individual elements are used unless it is specifically required to indicate the scanning column numbers.

The signal read circuits 301 each comprise transistors 302 and 303, an output capacitor 304 and a constant current circuit 305. Column scanning terminals 311 of the individual signal read circuits 301 are connected with a horizontal scanning circuit 412. In addition, column connection terminals 321 of the individual signal read circuits 301 are connected with the vertical connection lines 161, 162, 163, . . . of the photoelectric conversion element array 100.

On/off control of the transistor 303 is achieved by a control signal CP applied to a terminal 331 via connection line 362 of the output circuit 300. When the transistor 303 is turned on, an electrode 307 becomes grounded via a connection line 363. With this, the state of the output capacitor 304 is initialized. In other words, the black level of the pixel is determined.

On/off control of the transistor 302 is achieved by a signal H (j) applied to the column scanning terminal 311 of the signal read circuit 301. When the transistor 302 is turned on, the electrical charge at the output capacitor 304 is transferred to an output line 361.

The electrical charge at the output line 361 is amplified by the amplifier 351 and is output as a voltage to an output terminal 360. On/off control of the transistor 352 is achieved by a signal Hrst applied to a terminal 341. When the transistor 352 is turned on, the output line 361 becomes grounded to initialize the input level at the amplifier 351.

FIGS. 18 and 19 illustrate the timing of various control signals applied by the vertical scanning circuit 411 to the reset control circuit 200 and various control signals applied by the horizontal scanning circuit 412 to the output circuit 300.

At a time point t1 in FIG. 18, a signal SS(i) at the ith scanning line is set to high H, so that the transistor 211 is turned on and the transistor 212 is turned off in the switching circuit 201(i) in FIG. 15.

Consequently, the signal 0RSD is applied to the photoelectric conversion element array 100 as RSD(i). In addition, the common line 221 is cut off from the signal line 220. Since the transistor Q3 of a photoelectric conversion cell 10 is turned on when the level of the signal RSG(i) is low, the reset potential (reference voltage) of the signal RSD(i) is applied to the gate terminal of the transistor Q1. In other words, the reset potential with the signal 0RSD at low L is applied to the gate terminal of the transistor Q1.

At the same time, at all the scanning lines other than the ith scanning line, the signals SS(i+1), SS(i+2), . . . are at low L, and consequently, the transistors 211 are turned off and the transistors 212 are turned on in the switching circuits 201 in FIG. 15.

Thus, the application of the signal 0RSD to the signal line 220 is stopped. In addition, the signal line 220 is connected with the common line 221 or 222 via the transistors 212. As a result, the currents of the photometric signals output from the photometering pixels PB at the individual scanning lines other than the ith scanning line emerge at the common lines 221 and 222. In other words, the photometric signals can be obtained as signal voltages VDL and VDR from the current to voltage converters 401 and 402.

At all the scanning lines except for the ith scanning line, the potentials at the signal lines 220, 221 and 222 are fixed at the potential Vref which is equal to or smaller than the reset potential. This has a purpose for the JFETs at not selected lines not to be turned on, and is due to the characteristics of the current to voltage converters 401 and 402 illustrated in FIG. 13.

Between the time point t1 and a time point t2 in FIG. 18, the level of the signal RSD(i) is switched to a specific read potential (high level H). Since the transistor Q3 of a photoelectric conversion cell 10 is turned off by the signal RSG(i) at the time point t2, the application of the signal RSD(i) to the gate terminal of the transistor Q1 is stopped.

At this point, the transistor Q1 outputs a black level (the level corresponding to an unexposed state) to the terminal T25(T15).

Since the signal CP shifts to high level H, at a time point t3 in FIG. 18, the transistor 303 of each signal read circuit 301 illustrated in FIG. 16 is turned on. As a result, the electrode 307 becomes grounded to clamp the potential of one of the electrodes at the output capacitor 304 to the black level.

At time point t4 in FIG. 18, a signal TG(i) shifts to low level L. The signal TG(i) is applied to the terminal T21(T11) of each photoelectric conversion cell 10. Consequently, the transistor Q2 illustrated in FIGS. 11 and 12 is turned on. As a result, the electrical charge generated and stored through the photoelectric conversion performed at the first photodiode PD1 is transferred to the gate terminal of the transistor Q1 via the transistor Q2.

The signal TG(i) is commonly applied to all the photoelectric conversion cells 10 at the ith scanning line. Consequently, at the great number of individual photoelectric conversion cells 10 arrayed in the direction of the X axis, the stored charge at the first photodiodes PD1 is transferred to the gate terminals of the transistors Q1 in a batch.

The signal corresponding to the level of the electrical charge that has been transferred is amplified by the transistor Q1 and is applied to the output circuit 300 from the terminal T25(T15). The signal charges the output capacitor 304 at each signal read circuit 301 illustrated in FIG. 16. As a result, the voltage corresponding to the output level at the transistor Q1 emerges at the electrode 307 of the signal read circuit 301.

When the transfer of the stored charge is completed, the signal TG(i) is reset to high level H, thereby turning off the transistors Q2. As a result, the charge storage operation at the first photodiode PD1 restarts.

The signal read for the ith scanning line is performed between the time point t1 and a time point t5 in FIG. 18. Through a similar control procedure as that described above, a signal read is sequentially performed for the individual scanning lines, i.e., the (i+1)th, (i+2)th, (i+3)th, . . . scanning lines following the time point t5.

At a time point t9 in FIG. 19, the signal Hrst shifts to high level. This signal Hrst is applied to the transistor 352 via the terminal 341 illustrated in FIG. 16. Since the transistor 352 is turned on when the signal Hrst is set to high, the input level at the amplifier 351 becomes initialized. After the initialization, the signal Hrst is reset to low.

At a time point t10 in FIG. 19, the signal H(j) applied to the column scanning terminal 311(j) in the jth column in the direction of the X axis is set to high (see FIG. 16). The signals H(j+1), H(j+2), H(j+3), . . . that are applied to the column scanning terminals in the other columns are sustained at low level.

In this case, since the transistor 302 of the signal read circuit 301(j) in the jth column is turned on, the potential at the electrode 307 is transferred to the signal line 361. When the transfer is completed, the signal H(j) is reset to low, thereby turning off the transistor 302. Likewise, at time points t11, t12, t13, . . . in FIG. 19, the potentials at the electrodes 307 of the signal read circuits 301(j) in the (j+1)th, (j+2)th, (j+3)th, . . . columns are sequentially transferred to the signal line 361.

Thus, the signals corresponding to the stored electrical charges achieved at the photoelectric conversion cells 10 in the individual columns sequentially emerge with intervals corresponding to the pixel cycle TA, at the input of the amplifier 351.

To summarize the explanation given above, at the photometering pixel PB, a light receiving element constituted of the second photodiode PD2 is formed in the area corresponding to the opening portion formed for photometry as well as the first photodiode PD1.

At the first photodiode PD1, the electrical charge corresponding to the intensity of received light is stored. The electrical charge stored at the first photodiode PD1 is read after a specific length of storage time has elapsed. The second photodiode PD2 generates the electrical charge corresponding to the intensity of the light received at the position which is almost the same as that at the first photodiode PD1.

The electrical charge generated by the second photodiode PD2 can be extracted separately from the electrical charge of the first photodiode PD1 even while the first photodiode PD1 is in the process of storing. Consequently, by checking the electrical charge output by the second photodiode PD2 (hereafter referred to as the photometric signal), real-time detection of the exposure state at the second photodiode PD2 becomes possible.

At the non-photometering pixel PA, light to the second photodiode PD2 is blocked and, therefore, the second photodiode PD2 does not function. Due to the structure of the image capturing device, the signal lines for extracting the photometric signals from the individual pixels are connected to a common signal line. This common signal line connects the great number of pixels that constitute one line in the horizontal direction at the image capturing device.

Consequently, when a great number of photometering pixels PB are provided on one line in the horizontal direction, the photometric signals output from the individual pixels are added together on the common signal line shared by the great number of pixels. In other words, the photometric signal is output from the image capturing device as the level indicating the average quantity of light received at the great number of photometering pixels PB arrayed in the horizontal direction. Thus, if only photometering pixels PB are provided, the object area for photometry in the horizontal direction on the image capturing surface will be fixed at one position only.

In an electronic camera and the like, it is desirable that the object area for photometry can be switched in correspondence to the type of subject and in correspondence to changes in the photographing environment. In the image capturing device according to the present invention, one line in the horizontal scanning direction is constituted of a plurality of photometering pixels PB and a plurality of non-photometering pixels PA. In addition, there are a plurality of array patterns of the photometering pixels PB and the non-photometering pixels PA in each line. Furthermore, in adjacent lines in the vertical scanning direction, the photometering pixels PB and the non-photometering pixels PA are arrayed while achieving different array patterns from each other.

The signal lines for extracting photometric signals in the horizontal direction are each connected with a great number of pixels. However, photometric signals that are independent of one another can be extracted at the individual lines in the vertical direction. Consequently, in the ith line in the vertical direction, for instance, the photometering pixels PB and the non-photometering pixels PA are arrayed achieving the specific first array pattern with the photometering pixels PB and the non-photometering pixels PA arrayed achieving the specific second array pattern in the adjacent (i+1)th line.

In this structure, the photometering pixels PB in the ith line and the photometering pixels PB in the (i+1)th line are provided at different positions from each other in the horizontal direction. Thus, the positions that constitute the objects of photometry in the horizontal direction are different for the photometric signal extracted from the ith line and the photometric signal extracted from the (i+1)th line. Because of this, by switching the position of the line at which the photometric signal is to be extracted to the position of the adjacent line in the vertical direction, the photometry object position in the horizontal scanning direction can be switched. In other words, a photometric signal can be extracted from a plurality of areas in the horizontal scanning direction.

In addition, the array pattern of the photometering pixels PB is alternately switched in every line in the vertical scanning direction between the first array pattern and the second array pattern. For instance, the first array pattern is allocated to lines assigned with odd-numbers in the vertical direction, whereas the second array pattern is allocated to lines having even-numbers in the vertical direction.

In this case, by switching between an odd-numbered line and an even-numbered line, the position of the photometry object area in the horizontal direction is switched. By switching above, the position of the photometry object area changes by only one pixel pitch in the vertical direction. In addition, by adding together the photometric signals at a plurality of alternate lines, a photometric signal at a high level can be obtained and, as a result, the photometric sensitivity is improved.

The photometric signal from each pixel is extracted from the terminal T23 via the reset potential supply electrode 11 at the transistor Q3. The current to voltage converters 401 and 402 connected to the terminals T23 convert the current levels of the photometric signals to voltage levels for output.

The current to voltage converters 401 and 402 essentially do not affect the potentials at the terminals T23. Consequently, the difference between a photometering pixel PB that generates a photometric signal and a non-photometering pixel PA which does not generate a photometric signal does not affect the charge storage operation and the charge read operation at the first photodiode PD1. In addition, since the voltage indicating the exposure state is generated based upon the current of the photometric signal, an integral operation or the like that would cause a time delay is not required. In other words, real-time detection of the exposure state is achieved.

The switching circuit 201 connected to the terminal 23 switches between the application of the reset potential (reference voltage) to the terminal T23 and the extraction of the photometric signal from the terminal T23. The photometric signal can be extracted via the switching circuit 201 except when applying the reset potential to the terminal T23 to implement a reset operation.

The amplifier portion of each pixel is constituted of a junction-type field effect transistor. The use of the field effect transistor makes it less likely that the stored electrical charge will be affected by an external disturbance, to suppress the generation of noise.

Second Embodiment

Figure 20:
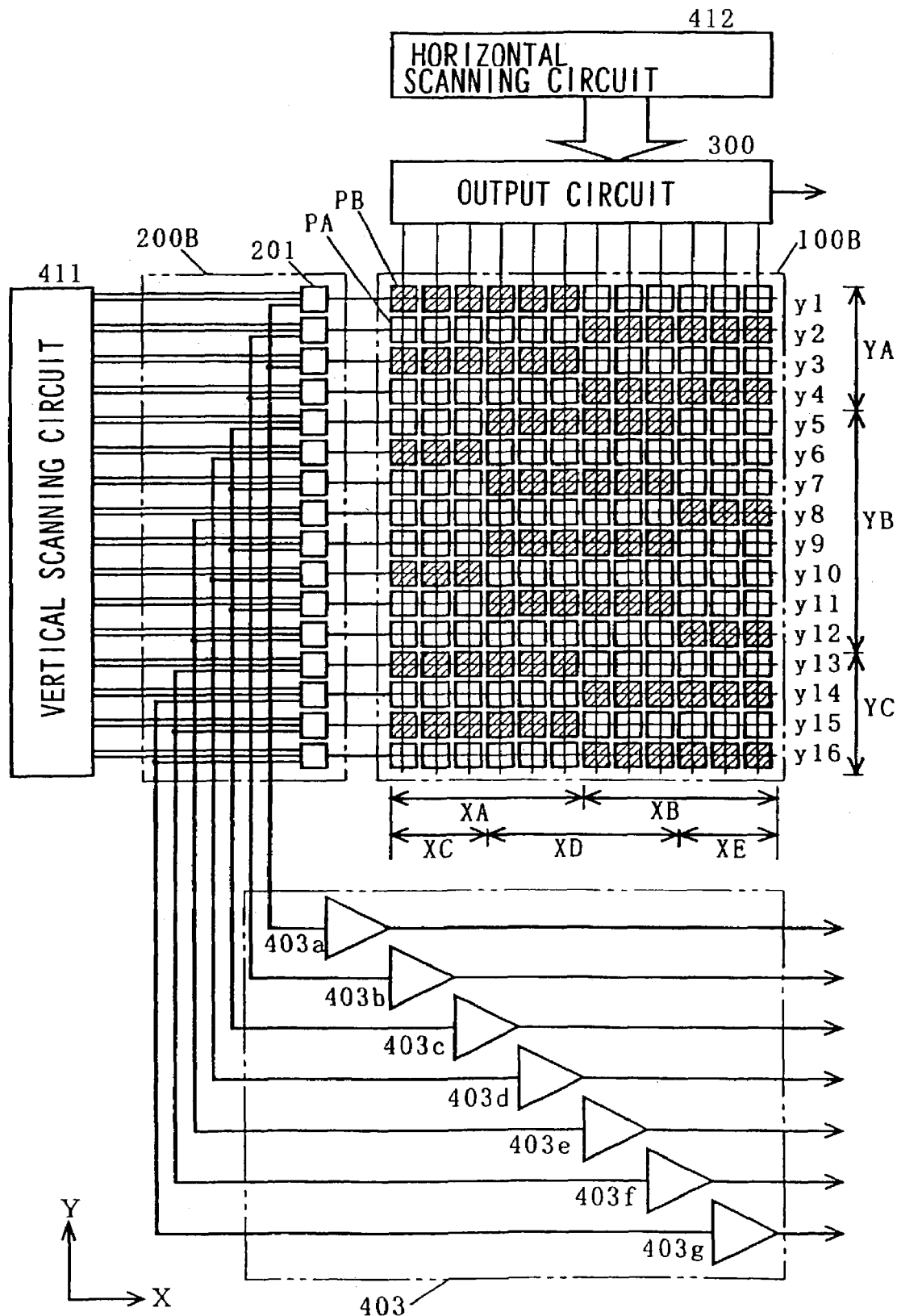
FIG. 20 is a block diagram illustrating the basic structure of the overall image capturing device in a second embodiment.

FIG. 20 illustrates the structure of the image capturing device in the second embodiment. This embodiment corresponds to claim 3.

The embodiment is a variation of the first embodiment explained above. In FIG. 20, the same reference numbers are assigned to elements identical to those in the first embodiment. In addition, the features that are identical to those in the first embodiment are not explained.

The main differences from the first embodiment are the array patterns of non-photometering pixels PA and photometering pixels PB in a photoelectric conversion element array 100B and the division of photometering areas.

In addition, as a result of the change in the photometering areas, the internal wiring at a reset control circuit 200B is changed. Furthermore, a current to voltage conversion unit 403 internally provided with seven current to voltage converters 403a~403g for extracting or taking out photometric signals in the individual photometering areas is provided.

The following is an explanation of the array patterns of the non-photometering pixels PA and the photometering pixels PB in the photoelectric conversion element array 100B in reference to FIG. 20.

At the individual scanning lines at positions indicated as y1, y3, y13 and y15, the photometering pixels PB are provided over the range indicated as XA in the direction of the X axis, with the non-photometering pixels PA provided over the range indicated as XB. At the scanning lines indicated as y1, y3, y13 and y15, the non-photometering pixels PA and the photometering pixels PB are arrayed achieving identical array patterns.

At the individual scanning lines at positions indicated as y2, y4, y14 and y16, the non-photometering pixels PA are provided over the range XA in the direction of the X axis, with the photometering pixels PB provided over the range XB. At the scanning lines indicated as y2, y4, y14 and y16, the non-photometering pixels PA and the photometering pixels PB are arrayed achieving identical array patterns.

At the individual scanning lines at positions indicated as y5, y7, y9 and y11, the photometering pixels PB are provided over the range indicated as XD in the direction of the X axis, with the non-photometering pixels PA provided over the range indicated as XC and over the range indicated as XE. At the scanning lines indicated as y5, y7, y9 and y11, the non-photometering pixels PA and the photometering pixels PB are arrayed achieving identical array patterns.

At the individual scanning lines at positions indicated as y6 and y10, the photometering pixels PB are provided over the range XC in the direction of the X axis, with the non-photometering pixels PA provided over the range XD and over the range XE. At the scanning lines indicated as y6 and y10, the non-photometering pixels PA and the photometering pixels PB are arrayed achieving identical array patterns.

At the individual scanning lines at positions indicated as y8 and y12, the photometering pixels PB are provided over the range XE in the direction of the X axis, with the non-photometering pixels PA provided over the range XC and over the range XD. At the scanning lines indicated as y8 and y12, the non-photometering pixels PA and the photometering pixels PB are arrayed achieving identical array patterns.

A signal line for extracting photometric signals is commonly connected with the scanning lines indicated as y1 an y3 inside the reset control circuit 200B. This signal line is connected to the current to voltage converter 403a.

Consequently, a photometric signal in the area ranging over XA in the direction of the X axis and ranging over YA in the direction of the Y axis is obtained at the output of the current to voltage converter 403a.

A signal line for extracting photometric signals is commonly connected with the scanning lines indicated as y2 and y4 inside the reset control circuit 200B. This signal line is connected to the current to voltage converter 403b.

Consequently, a photometric signal in the area ranging over XB in the direction of the X axis and ranging over YA in the direction of the Y axis is obtained at the output of the current to voltage converter 403*b*.

A signal line for extracting photometric signals is commonly connected with the scanning lines indicated as y5, y7, y9 and y11 inside the reset control circuit 200B. This signal line is connected to the current to voltage converter 403*c*.

Consequently, a photometric signal in the area ranging over XD in the direction of the X axis and ranging over YB in the direction of the Y axis is obtained at the output of the current to voltage converter 403*c*.

A signal line for extracting photometric signals is commonly connected with the scanning lines indicated as y6 and y10 inside the reset control circuit 200B. This signal line is connected to the current to voltage converter 403*d*.

Consequently, a photometric signal in the area ranging over XC in the direction of the X axis and ranging over YB in the direction of the Y axis is obtained at the output of the current to voltage converter 403*d*.

A signal line for extracting photometric signals is commonly connected with the scanning lines indicated as y8 and y12 inside the reset control circuit 200B. This signal line is connected to the current to voltage converter 403*e*.

Consequently, a photometric signal in the area ranging over XE in the direction of the X axis and ranging over YB in the direction of the Y axis is obtained at the output of the current to voltage converter 403*e*.

A signal line for extracting photometric signals is commonly connected with the scanning lines indicated as y13 and y15 inside the reset control circuit 200B. This signal line is connected to the current to voltage converter 403*f*.

Consequently, a photometric signal in the area ranging over XA in the direction of the X axis and ranging over YC in the direction of the Y axis is obtained at the output of the current to voltage converter 403*f*.

A signal line for extracting photometric signals is commonly connected with the scanning lines indicated as y14 and y16 inside the reset control circuit 200B. This signal line is connected to the current to voltage converter 403*g*.

Consequently, a photometric signal in the area ranging over XB in the direction of the X axis and ranging over YC in the direction of the Y axis is obtained at the output of the current to voltage converter 403*g*.

In this embodiment, the photometric signals in the seven partitioned areas as described above can be separately extracted from the outputs of the current to voltage converters 403*a*~403*g*.

While the explanation is given in reference to the embodiment above using an example with five array patterns, the array pattern at y6 and y10 and the array pattern at y8 and y12 may be incorporated into one array pattern. In other words, an array pattern having photometering pixels PB over the ranges XC and XE in the direction of the X axis and non-photometering pixels PA over the range XD may be prepared with the lines at y6, y8, y10 and y12 assigned with this array pattern.

When this structure is adopted, the first array pattern and the second array pattern are alternately allocated to individual lines or individual pluralities of lines in the vertical scanning direction in the first photometering area (ranges over YA and YC) on the image capturing device, with the third array pattern and the fourth array pattern alternately allocated to the individual lines or individual pluralities of lines in the vertical scanning direction in the second photometering area (range over YB) on the image capturing device.

In the first photometering area, the photometry object position in the horizontal direction is switched to either the first area or a second area by switching the line position at which the photometric signal is extracted. In the second photometering area, the photometry object position in the horizontal direction is switched to either a third area or a fourth area by switching the line position at which the photometric signal is extracted.

Consequently, in response to the switching between the first photometering area and the second photometering area, the photometry object range in the horizontal direction can be switched. For instance, the photometering range (width and position) in the horizontal direction can be switched between the central area and the upper and lower areas on the photographic image plane.

With the array patterns illustrated in FIG. 20, the central area on the photographic image plane (range over YB) can be switched over three photometering ranges, i.e., XC, XD and XE in the direction of the X axis. If XD and XE are selected at the same time, switching can be implemented between two photometering ranges, i.e., the range over XD and the range over XC+XE, as in the example with four array patterns described earlier.

It is to be noted that the array patterns do not have to be limited to those explained above, the example illustrated in FIG. 20 or the example in the first embodiment illustrated in FIG. 17. Although, in the above, adjacent patterns in the vertical direction have array patterns that are different from each other, the array pattern may varies every a plurality of lines. Various other combinations of patterns may be conceived to suit specific requirements. Furthermore, all the pixels may be constituted of photometering pixels PB. When a photometering area is divided into plural areas only in the vertical direction, all pixels may be constituted of photometering pixels PB, and predetermined horizontal scanning lines may be selected. When all lines are selected, photometry is performed on the whole image screen. In the case that all pixels are constituted of photometering pixels PB, sensitivity of the selected photometering area is improved.

By making various contrivances in regard to the array patterns of photometering pixels PB and non-photometering pixels PA as described above, various types of photometry including multiple-segment photometering and spot photometering become possible.

It is to be noted that while an example in which a common terminal is used to function as both the reset potential supply terminal and the photometric signal extraction terminal is explained in reference to the embodiments above, separate terminals may be provided to allow all the pixels in the photoelectric conversion element array 100 to be constituted of photometering pixels PB so that only the pixels needed for photometry can be selectively connected through external wiring. This, too, will allow various array patterns as those explained earlier in reference to the embodiments to be provided.

In addition, while the entire structure illustrated in FIG. 13 is referred to as the image capturing device in reference to the embodiment, the term "image capturing device" is also used when specifically referring to the photoelectric conversion element array 100 in the device. However, the entire structure illustrated in FIG. 13 may be referred to as an image capturing device with the photoelectric conversion element array 100 referred to as an image capturing element instead.

What is claimed is:

1. An image capturing device in which a plurality of pixels are two-dimensionally arrayed on one semiconductor substrate, comprising:

first pixels each provided with a first photoelectric conversion portion for capturing an image of a subject, a first amplifier portion for amplifying a signal generated at said first photoelectric conversion portion, a first reset portion for resetting said signal generated at said first photoelectric conversion portion and a photoelectric conversion portion for photometry employed for photometering the subject; and second pixels each provided with a second photoelectric conversion portion for capturing the image of the subject, a second amplifier portion for amplifying a signal generated by said second photoelectric conversion portion and a second reset portion for resetting the signal generated at said second photoelectric conversion portion, wherein said first pixels and said second pixels are arrayed with an specifically combined array pattern;

said plurality of pixels are arrayed two-dimensionally in a first direction and in a second direction perpendicular to the first direction;

a plurality of said first pixels and a plurality of said second pixels are arrayed in each of a plurality of lines that extend in the first direction;

a plurality of types of line array patterns defined by an arrangement of said first pixels and said second pixels in each of said line are provided; and said lines are arrayed in the second direction with a predetermined combination of said plurality of types of line array patterns.

2. An image capturing device according to claim 1, wherein:

lines that are adjacent to each other in the second direction respectively have types of line array patterns which are different from each other.

3. An image capturing device according to claim 1, further comprising:

a selection circuit that selects lines that have an identical type of line array pattern, among lines that are arrayed with said plurality of types of line array patterns.

4. An image capturing device according to claim 1, wherein:

said photoelectric conversion portions for photometry of said first pixels that present in a line extending in said first direction have a common output line; and said output line is common to a reset potential supply line that supplies a reset potential to said first reset portions of said first pixels and said second reset portions of said second pixels that are present in a line extending in said first direction.

5. An image capturing device in which a plurality of pixels are two-dimensionally arrayed on one semiconductor substrate, comprising:

first pixels each provided with a first photoelectric conversion portion for capturing an image of a subject, a first amplifier portion for amplifying a signal generated at said first photoelectric conversion portion, a first reset portion for resetting said signal generated at said first photoelectric conversion portion and an opening portion for photometry that is formed on at least a part of said first reset portion; and second pixels each provided with a second photoelectric conversion portion for capturing the image of the subject, a second amplifier portion for amplifying a signal generated by said second photoelectric conversion portion and a second reset portion for resetting the signal generated at said second photoelectric conversion portion, wherein:

each line in a horizontal scanning direction has said first pixels and said second pixels;

a plurality of types of array patterns defined by an arrangement of said first pixels and said second pixels are provided;

in each of the lines that are adjacent to each other in the vertical direction, said first pixels and said second pixels are arrayed with different types of array patterns from each other.

6. An image capturing device according to claim 5, wherein:

a first type of array pattern having said first pixels provided in a first area in the horizontal scanning direction and a second type of array pattern having said first pixels provided in a second area in the horizontal scanning direction are alternately provided every other line in the vertical scanning direction.

7. An image capturing device according to claim 5, wherein:

at least, a first type of array pattern having said first pixels provided in a first area in the horizontal scanning direction, a second type of array pattern having said first pixels provided in a second area in the horizontal scanning direction, a third type of array pattern having said first pixels provided in a third area in the horizontal scanning direction and a fourth type of array pattern having said first pixels provided in a fourth area in the horizontal scanning direction, are provided; and a first photometering area having said first type of array pattern and said second type of array pattern alternately allocated to individual lines or individual pluralities of lines in the vertical scanning direction and a second photometering area having said third type of array pattern and said fourth type of array pattern alternately allocated to individual lines or individual pluralities of lines in the vertical scanning direction, are provided at different locations from each other in the vertical scanning direction.

8. An image capturing device according to claim 5, wherein:

a current to voltage converter connected to a reference voltage application terminal of said first reset portion, which converts a level of current at said photoelectric conversion portion for photometry to a voltage level, is provided.

9. An image capturing device according to claim 5, wherein:

a switching circuit connected to reference voltage application terminals of said first reset portion and said second reset portion, which switches between application of a reference voltage and extraction of a photometric signal, is provided.

10. An image capturing device according to claim 5, wherein:

said first amplifier portion and said second amplifier portion each have a junction-type field effect transistor.

11. An image capturing device according to claim 5, wherein:

each of said first pixel and said second pixel has identical semiconductor component elements; and at least a part of the semiconductor component elements of said first reset portion and said opening portion form a photoelectric conversion portion for photometry.

* * * * *